(12) United States Patent
Tagawa

(10) Patent No.: US 11,187,984 B2
(45) Date of Patent: Nov. 30, 2021

(54) RESIST PATTERNING METHOD AND RESIST MATERIAL

(71) Applicant: OSAKA UNIVERSITY, Osaka (JP)

(72) Inventor: Seiichi Tagawa, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 222 days.

(21) Appl. No.: 15/779,013

(22) PCT Filed: Nov. 25, 2016

(86) PCT No.: PCT/JP2016/085024
§ 371 (c)(1),
(2) Date: May 24, 2018

(87) PCT Pub. No.: WO2017/090745
PCT Pub. Date: Jun. 1, 2017

(65) Prior Publication Data
US 2018/0356731 A1    Dec. 13, 2018

(30) Foreign Application Priority Data

Nov. 25, 2015    (JP) .............................. JP2015-229767

(51) Int. Cl.
| | | |
|---|---|---|
| *G03F 7/20* | (2006.01) | |
| *G03F 7/40* | (2006.01) | |
| *G03F 7/38* | (2006.01) | |
| *G03F 7/004* | (2006.01) | |
| *G03F 7/038* | (2006.01) | |
| *G03F 7/039* | (2006.01) | |
| *G03F 7/11* | (2006.01) | |
| *G03F 7/075* | (2006.01) | |
| *G03F 7/09* | (2006.01) | |

(52) U.S. Cl.
CPC ............ *G03F 7/2022* (2013.01); *G03F 7/004* (2013.01); *G03F 7/0045* (2013.01); *G03F 7/0382* (2013.01); *G03F 7/0392* (2013.01); *G03F 7/11* (2013.01); *G03F 7/20* (2013.01); *G03F 7/38* (2013.01); *G03F 7/40* (2013.01); *G03F 7/075* (2013.01); *G03F 7/094* (2013.01)

(58) Field of Classification Search
CPC .................................................. G03F 7/2022
See application file for complete search history.

(56) References Cited

U.S. PATENT DOCUMENTS

| | | | | |
|---|---|---|---|---|
| 4,164,458 A | * | 8/1979 | Patel ...................... | C08F 255/00 522/117 |
| 10,025,187 B2 | * | 7/2018 | Nagahara .................. | G03F 1/26 |
| 2006/0269879 A1 | | 11/2006 | Elian et al. | |
| 2011/0147985 A1 | * | 6/2011 | Cheng ..................... | G03F 7/165 264/225 |
| 2013/0029272 A1 | | 1/2013 | Ishikura | |
| 2016/0004160 A1 | | 1/2016 | Tagawa et al. | |
| 2016/0357103 A1 | | 12/2016 | Nagahara et al. | |
| 2017/0097570 A1 | | 4/2017 | Tagawa | |

FOREIGN PATENT DOCUMENTS

| | | |
|---|---|---|
| JP | H04-363014 A | 12/1992 |
| JP | H05-021331 A | 1/1993 |
| JP | H05-144693 A | 6/1993 |
| JP | H06-053106 A | 2/1994 |
| JP | 2002-174894 A | 6/2002 |
| JP | 2005-150182 A | 6/2005 |
| JP | 2008-543033 A | 11/2008 |
| JP | 2011-252967 A | 12/2011 |
| JP | 2015-172741 A | 10/2015 |
| JP | 2017-054047 A | 3/2017 |
| WO | 2014/129556 A1 | 8/2014 |
| WO | 2014/208076 A1 | 12/2014 |
| WO | 2015/178464 A1 | 11/2015 |

OTHER PUBLICATIONS

The extended European search report issued by the European Patent Office dated Jun. 28, 2019, which corresponds to European Patent Application No. 16868688.9-1022 and is related to U.S. Appl. No. 15/779,013.
International Search Report issued in PCT/JP2016/085024; dated Feb. 21, 2017.
Tagawa et al.; "Super High Sensitivity Enhancement by Photo-Sensitized Chemically Amplified Resist (PS-CAR) Process"; Journal of Photopolymer Science and Technology; vol. 26, No. 6; 2013; pp. 825-830.
Kanzawa; "Resist Pattern Forming Method"; Toshiba Technology Publication; vol. 13-29 Issue No. 95-3963; pp. 63-64.

* cited by examiner

*Primary Examiner* — Kathleen Duda
(74) *Attorney, Agent, or Firm* — Studebaker & Brackett PC

(57) ABSTRACT

A resist patterning method includes a resist layer forming step, a patterned exposure step, a flood exposure step, and a developing step. In the resist layer forming step, a resist layer is formed on a substrate. In the patterned exposure step, a sensitizer is produced from a sensitizer precursor in the resist layer. In the flood exposure step, flood exposure is performed on the resist layer in which the sensitizer has been produced to produce an acid from a strong acid generator. In the developing step, the resist layer is developed. The patterned exposure step includes: producing a strong acid from the strong acid generator; producing the sensitizer through a reaction between the strong acid and the sensitizer precursor; producing a weak acid through a reaction between the strong acid and a base; and producing the sensitizer through a reaction between the weak acid and the sensitizer precursor.

10 Claims, 12 Drawing Sheets

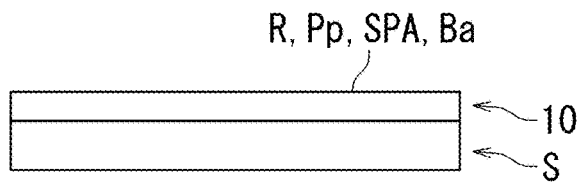
FIG. 1A
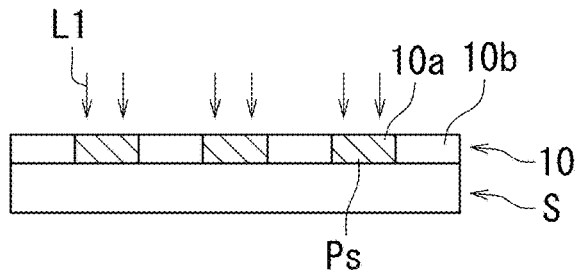
FIG. 1B
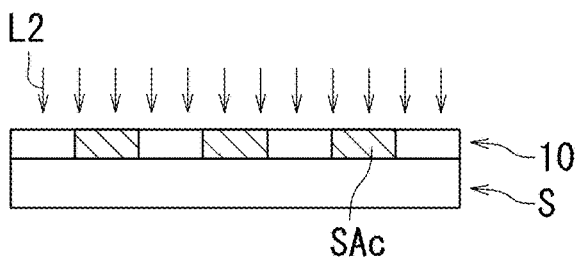
FIG. 1C
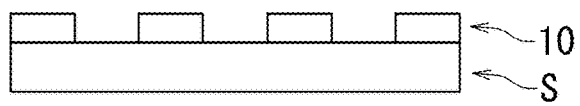
FIG. 1D
SPA → SAc     (1)
SAc + Pp → Ps     (2)
SAc + Ba → Ne + WAc     (3a)
WAc + Pp → Ps     (3b)
FIG. 2
$$SPA \xrightarrow{Ps} SAc$$
FIG. 3

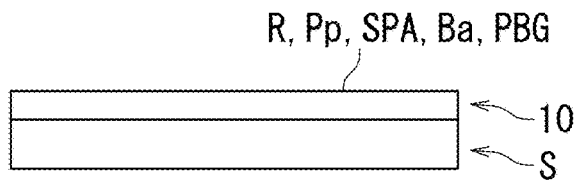
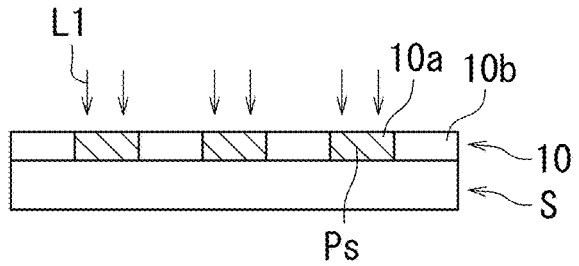
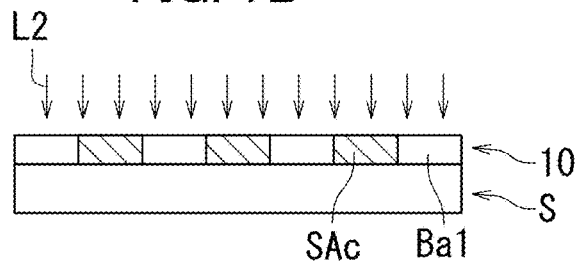
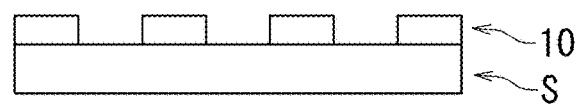
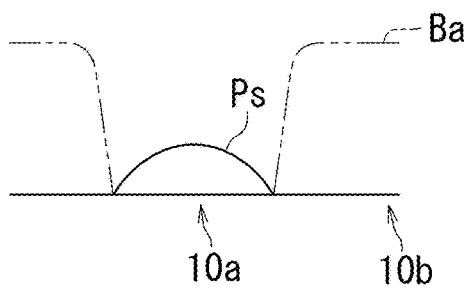
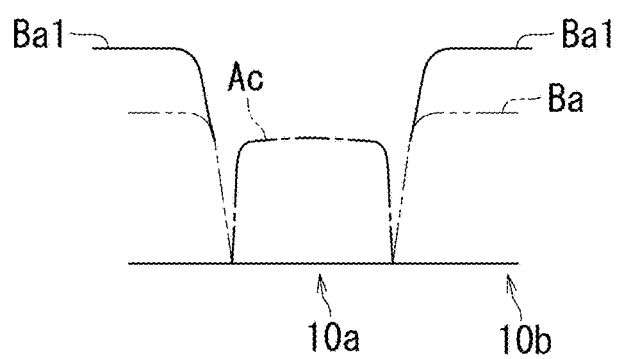

RESIST PATTERNING METHOD AND RESIST MATERIAL

TECHNICAL FIELD

The present invention relates to resist patterning methods and resist materials.

BACKGROUND ART

Miniaturization of semiconductor devices has progressed over years for achieving higher integration and higher speed of semiconductor devices. Accordingly, there has been a demand for finer patterns in photolithographic steps for semiconductor devices. As a technique to achieve a finer pattern, decreasing the wavelength of an exposure source has been mainly contemplated. For example, a technique using extreme ultraviolet light (EUV, wavelength: 13.5 nm) has recently undergone development as being promising in production of next-generation semiconductor devices.

However, it is difficult to develop a light source device with a power (250 W) for a light source in a light exposure device that is needed to apply the device to mass production. It is therefore still necessary to perform light exposure for a long period of time in order to form a latent pattern image. Meanwhile, an electron beam direct writing method uses an electron beam (EB) having a small beam diameter and therefore allows formation of a fine pattern with high dimensional precision but takes more time to write a more complicated and larger-area pattern. As described above, the problem with the exposure techniques using extreme ultraviolet light and an electron beam is that the throughput is low while a fine pattern can be formed.

In order to make up for the insufficient light source intensity, improvement of the sensitivity of resist materials is being promoted so that the period of time of exposure is reduced as much as possible. For example, a resist composition disclosed in Patent Literature 1 is composed of a specified resin and a specified compound, and thus improved in resist sensitivity and resolution.

CITATION LIST

Patent Literature

[Patent Literature 11]
Japanese Patent Application Laid-Open Publication No. 2002-174894

SUMMARY OF INVENTION

Technical Problem

However, there is a trade-off between three important properties of a resist, that is, the sensitivity, the resolution, and the line width roughness (LWR); merely increasing the sensitivity of a resist leads to decrease in the resolution and increase in the LWR. Accordingly, conventional techniques have a limit to increasing the sensitivity of a resist without decreasing the resolution and without increasing the line width roughness, and therefore are unable to sufficiently solve the problem of low throughput. Furthermore, roughness of a pattern due to photon shot noise has recently been considered more problematic and important than the trade-off, which used to be the most important problem. However, no solution therefor has been found so far other than achieving a higher-power light source and developing a resist that is highly absorptive of exposing light.

In view of the above-described problems, the present invention has been made to provide a resist patterning method and a resist material that can improve the sensitivity of resist layers and reduce roughness due to photon shot noise while solving the trade-off between the sensitivity, the resolution, and the line width roughness (LWR).

Solution to Problem

A resist patterning method according to the present invention includes: a resist layer forming step of forming, on a substrate, a resist layer containing a base resin, a sensitizer precursor, a strong acid generator, and a base; a patterned exposure step of performing patterned exposure on the resist layer to produce a sensitizer from the sensitizer precursor; a flood exposure step of performing flood exposure on the resist layer in which the sensitizer has been produced to produce an acid from the strong acid generator after the patterned exposure step; and a developing step of developing the resist layer after the flood exposure step. The patterned exposure step includes: a step of producing a strong acid from the strong acid generator; a step of producing the sensitizer through a reaction between the strong acid and the sensitizer precursor; and a step of producing a weak acid through a reaction between the strong acid and the base, and producing the sensitizer through a reaction between the weak acid and the sensitizer precursor.

According to an embodiment, in the resist layer forming step, the sensitizer precursor includes at least one compound selected from the group consisting of 1,1-diphenyl-3-(2-naphthyl)propargyl alcohol, 1,1-diphenyl-3-phenyl propargyl alcohol, 1,1-diphenyl-3-para-chlorophenyl propargyl alcohol, 1,1-diphenyl-3-para-methylphenyl propargyl alcohol, 1,1-diphenyl-3-para-methoxyphenyl propargyl alcohol, 1-phenyl-1-para-chlorophenyl-3-phenyl propargyl alcohol, 1-phenyl-1-para-methylphenyl-3-phenyl propargyl alcohol, 1-phenyl-1-para-methoxyphenyl-3-phenyl propargyl alcohol, 1,1-diphenyl-3-[4-(trifluoromethyl)phenyl]propargyl alcohol, and derivatives of any of the aforementioned compounds.

According to an embodiment, in the resist layer forming step, the base includes a photodecomposable base.

According to an embodiment, in the resist layer forming step, the resist layer further contains a base generator.

According to an embodiment, the flood exposure step includes: a first flood exposure step of performing first flood exposure through which the sensitizer is excited, and the acid is produced through a reaction between the excited sensitizer and the strong acid generator; and a second flood exposure step of performing second flood exposure through which a base is produced from the base generator.

The resist patterning method according to an embodiment further includes a modification step of performing a modification treatment for transforming the resist layer from a positive type to a negative type or vice versa after the flood exposure step.

The resist patterning method according to an embodiment further includes an underlayer forming step of forming an underlayer between the resist layer and the substrate.

The resist patterning method according to an embodiment further includes a topcoat forming step of forming a topcoat on the resist layer.

According to an embodiment, in the flood exposure step, a period of time of the flood exposure is not longer than one minute.

According to an embodiment, in the flood exposure step, an absorption spectrum of the sensitizer does not change during the flood exposure.

A resist material according to the present invention includes a resist composition containing a base resin, a sensitizer precursor, a strong acid generator, and a base. The sensitizer precursor includes at least one compound selected from the group consisting of 1,1-diphenyl-3-(2-naphthyl) propargyl alcohol, 1,1-diphenyl-3-phenyl propargyl alcohol, 1,1-diphenyl-3-para-chlorophenyl propargyl alcohol, 1,1-diphenyl-3-para-methylphenyl propargyl alcohol, 1,1-diphenyl-3-para-methoxyphenyl propargyl alcohol, 1-phenyl-1-para-chlorophenyl-3-phenyl propargyl alcohol, 1-phenyl-1-para-methylphenyl-3-phenyl propargyl alcohol, 1-phenyl-1-para-methoxyphenyl-3-phenyl propargyl alcohol, 1,1-diphenyl-3-[4-(trifluoromethyl)phenyl]propargyl alcohol, and derivatives of any of the aforementioned compounds. A sensitizer is produced through a reaction between the sensitizer precursor and a weak acid produced through a reaction between the base and a strong acid produced from the strong acid generator.

According to an embodiment, the base includes a photodecomposable base.

According to an embodiment, the resist composition further contains a base generator.

Advantageous Effects of Invention

The present invention can improve the sensitivity of resist layers and reduce roughness due to photon shot noise while solving the trade-off between the sensitivity, the resolution, and the line width roughness (LWR).

BRIEF DESCRIPTION OF DRAWINGS

FIGS. 1A to 1D are schematic diagrams each illustrating a process of an embodiment of a resist patterning method according to the present invention.

FIG. 2 is a diagram showing formulae representing main reactions that occur in a resist layer during patterned exposure.

FIG. 3 is a diagram showing a formula representing a main reaction that occurs in the resist layer during flood exposure.

FIGS. 7A to 7D are schematic diagrams each illustrating a process of an embodiment of a resist patterning method according to the present invention.

FIGS. 8A and 8B are schematic diagrams respectively illustrating concentration distribution in a resist layer after patterned exposure and concentration distribution in the resist layer after flood exposure.

DESCRIPTION OF EMBODIMENTS

Hereinafter, embodiments of a resist patterning method and a resist material according to the present invention will be described with reference to the drawings. However, the present invention is not limited to the following embodiments.

First, an embodiment of the resist patterning method and the resist material according to the present invention will be described with reference to FIGS. 1A to 4B. Note that resist layers including resist materials are classified into the following types: positive resist layers in which a portion thereof that is exposed to light becomes soluble in a developing solution; and negative resist layers in which a portion thereof that is exposed to light becomes insoluble in a developing solution. The following description takes a positive resist layer as an example. The resist layer may be a chemically amplified resist layer containing a strong acid generator that generates an acid upon exposure to light and a base material (base resin) whose solubility to a developing solution is changed by the action of the acid.

Figure 4A:
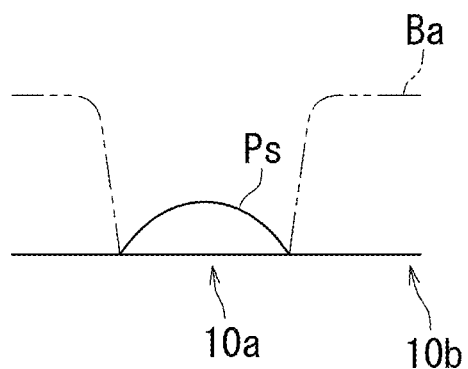
FIGS. 4A and 4B are schematic diagrams respectively illustrating concentration distribution in a resist layer after patterned exposure and concentration distribution in the resist layer after flood exposure.
Figure 4B:
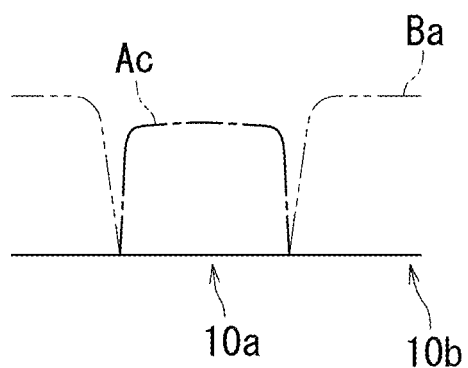

FIGS. 1A to 1D are schematic diagrams each illustrating a process of the embodiment of the resist patterning method according to the present invention. FIG. 2 shows formulae representing main reactions that occur in a resist layer during patterned exposure. FIG. 3 shows a formula of a main reaction that occurs in the resist layer during flood exposure. FIGS. 4A and 4B are schematic diagrams respectively illustrating concentration distribution in a resist layer after patterned exposure and concentration distribution in the resist layer after flood exposure.

First, a resist layer 10 is formed on a substrate S as illustrated in FIG. 1A. For example, the substrate S (for example, wafer) is prepared, and a resist material dissolved in a liquid is applied onto the substrate S and pre-baked to form the resist layer 10. Typically, a photolithography target (for example, a semiconductor layer or an insulating layer) is formed on a surface of the substrate S.

The resist layer 10 contains a base resin R, a sensitizer precursor Pp, a strong acid generator SPA (strong photo acid generator), and a base Ba. The resist layer 10 may be formed directly on the substrate S or may be formed on an underlayer disposed over the substrate S. The strong acid generator SPA, the sensitizer precursor Pp, and the base Ba each have a concentration that is substantially constant throughout the resist layer 10 regardless of location.

In the resist layer 10, for example, the sensitizer precursor Pp is contained in an amount of at least 0.1 parts by mass and no greater than 40 parts by mass, the strong acid generator SPA is contained in an amount of at least 0.1 parts by mass and no greater than 40 parts by mass, and the base Ba is contained in an amount of greater than 0 parts by mass and no greater than 40 parts by mass, relative to 100 parts by mass of the base resin R.

The base resin R is for example a methyl methacrylate-based polymer (hereinafter, may be referred to as "an MMA resin"). An intermediate, a radical, an ion (cation or anion), and the like are involved in a chemical reaction caused by at least one of patterned exposure L1 and flood exposure L2 to be described later. The MMA resin tends not to dissipate an intermediate, a radical, and an ion. The base resin R may contain a polyhydroxystyrene resin (PHS resin). Alternatively, the base resin R may be a mixture of an MMA resin and a PHS resin.

Alternatively, the base resin R may be a phenolic resin or any of various resins having for example an acetal-type protective group. In the case of EUV exposure or EB exposure, protons are generated mainly from the base resin R, move within the base resin R or among molecules of the base resin R, and react with anions generated through dissociation of the strong acid generator SPA to produce an acid. The base resin R may contain a low-molecular compound as well as a high-molecular compound. However, it is preferable that protons generated from a low-molecular compound move among molecules of the base resin and react with anions generated through dissociation of the strong acid generator SPA to produce a strong acid. Furthermore, the base resin R may be a resin from which protons that move within the base resin R or among molecules of the base resin R are not generated. Alternatively, the base resin R may be an inorganic substance.

Note that EUV or EB beam irradiation causes a radiochemical reaction in the resist layer 10, whereas ArF laser or KrF laser beam irradiation causes a photochemical reaction in the resist layer 10. As mentioned above, acid formation reactions that are initiated from an excited state of the strong acid generator SPA differ depending on the type of the source of a beam to irradiate.

The base resin R may be decomposed by at least one of the patterned exposure L1 and the flood exposure L2 to generate an intermediate, a radical, and an ion. In particular, use of an electron beam or an EUV beam as a beam for the patterned exposure L1 allows the base resin R to be decomposed relatively easily.

A sensitizer is produced from the sensitizer precursor Pp. The sensitizer precursor Pp may for example include at least one compound selected from the group consisting of 1,1-diphenyl-3-(2-naphthyl)propargyl alcohol, 1,1-diphenyl-3-phenyl propargyl alcohol, 1,1-diphenyl-3-para-chlorophenyl propargyl alcohol, 1,1-diphenyl-3-para-methylphenyl propargyl alcohol, 1,1-diphenyl-3-para-methoxyphenyl propargyl alcohol, 1-phenyl-1-para-chlorophenyl-3-phenyl propargyl alcohol, l-phenyl-1-para-methylphenyl-3-phenyl propargyl alcohol, 1-phenyl-1-para-methoxyphenyl-3-phenyl propargyl alcohol, 1,1-diphenyl-3-[4-(trifluoromethyl)phenyl]propargyl alcohol, and derivatives of any of the aforementioned compounds. The structural formula of 1,1-diphenyl-3-(2-naphthyl)propargyl alcohol is shown below.

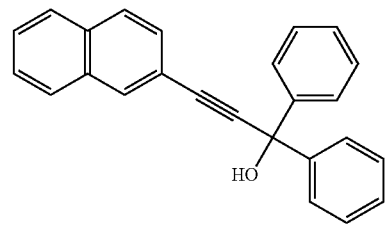

[Formula 1]

Derivatives of 1,1-diphenyl-3-(2-naphthyl)propargyl alcohol may for example be compounds obtained by substituting a phenyl group and a naphthyl group of 1,1-diphenyl-3-(2-naphthyl)propargyl alcohol with any of various other aromatic molecules such as a para-chlorophenyl group, a para-methoxyphenyl group, and a (trifluoromethyl) phenyl group.

The sensitizer precursor Pp may be mixed in the base resin R. Alternatively, the sensitizer precursor Pp may be bound to another component of the resist layer 10. For example, the sensitizer precursor Pp is bound to the base resin R.

In a configuration in which the sensitizer precursor Pp is of alcohol type, the resist layer 10 contains a radical generating component. The radical generating component may be mixed in the base resin R. Alternatively, the radical generating component may be bound to another component of the resist layer 10. For example, the radical generating component may be bound to the base resin R or bound to the strong acid generator SPA.

A radical produced from the radical generating component in the resist layer 10 causes a sensitizer Ps to be produced from the sensitizer precursor Pp. The sensitizer precursor Pp may for example be an alcohol-type sensitizer precursor. Alternatively, the sensitizer precursor Pp may be a mixture of an acetal-type sensitizer precursor and an alcohol-type sensitizer precursor.

The strong acid generator SPA may for example be iodonium salt ($R_2IX$)-based diphenyliodonium perfluorobutanesulfonate (DPI-PFBS) or sulfonium salt ($R_3SX$)-based triphenylsulfonium perfluorobutanesulfonate (TPS-PFBS). Alternatively, the strong acid generator SPA may be an iodonium salt such as PBpS-PFBS.

The strong acid generator SPA is preferably a bulky acid generator having a low diffusion coefficient. However, the strong acid generator SPA may be bound to the base resin R. The strong acid generator SPA is preferably an acid generator that efficiently undergoes electron transfer from the sensitizer Ps in an excited state. Furthermore, the concentration of the strong acid generator SPA is preferably so high that smooth electron transfer occurs. A single compound may function both as the sensitizer precursor Pp and as the strong acid generator SPA.

The base Ba preferably includes a photodecomposable base. The photodecomposable base may be referred to as a photodecomposable quencher (PDQ). For example, the base preferably includes at least one selected from the group consisting of sulfonium acetate, iodonium acetate, sulfonium salicylate, iodonium salicylate, o-nitrobenzyl cyclohexylcarbamate, and o-nitrobenzyl-n-octylcarbamate.

The base Ba may for example be mixed in the base resin R. Alternatively, the base Ba may be bound to another component of the resist layer 10. For example, the base Ba is bound to the base resin R. The base Ba preferably has a low diffusion coefficient.

Next, the patterned exposure L1 is performed on the resist layer 10 as illustrated in FIG. 1B. Regions 10a of the resist layer 10 are irradiated with the beam for the patterned exposure L1, but regions 10b of the resist layer 10 are not irradiated with the beam for the patterned exposure L1.

The patterned exposure L1 imparts energy to the regions 10a of the resist layer 10. In a configuration in which a pattern of the patterned exposure L1 is fine in order to achieve a high resolution, an energy intensity distribution may be approximated as a sine wave. The energy imparted to the regions 10a excites or ionizes a component of the resist layer 10 to produce an active substance, and the sensitizer Ps is eventually produced from the sensitizer precursor Pp in the resist layer 10. FIG. 4A illustrates concentration distribution of the sensitizer Ps and concentration distribution of the base Ba. The sensitizer Ps is present in the regions 10a to which energy has been imparted through the patterned exposure L1. The base Ba is present in the regions 10b to which energy has not been imparted through the patterned exposure L1.

More specifically, upon the patterned exposure L1 being performed on the resist layer 10, the following reactions occur in the resist layer 10. First, as represented by reaction formula (1) in FIG. 2, a strong acid SAc is produced from the strong acid generator SPA. The strong acid SAc has a concentration distribution that is substantially similar to the intensity distribution of the beam for the patterned exposure L1.

The strong acid SAc produced in the regions 10a reacts with the sensitizer precursor Pp to produce the sensitizer Ps as represented by reaction formula (2) in FIG. 2. Note that the concentration distribution of the sensitizer Ps produced with use of the strong acid SAc is sharp.

Furthermore, the strong acid SAc reacts with the base Ba to produce a neutralant Ne and a weak acid WAc as represented by reaction formula (3a) in FIG. 2. Since the resist layer 10 contains the base Ba as described above, the strong acid SAc is neutralized through a reaction with the base Ba, and thus the concentration distribution of the strong acid SAc becomes sharp. For example, acetic acid, propionic acid, cyclohexyl carboxylic acid, or salicylic acid is produced as the weak acid WAc. The weak acid WAc preferably has a relatively low diffusion coefficient.

Furthermore, the weak acid WAc reacts with the sensitizer precursor Pp to produce the sensitizer Ps as represented by reaction formula (3b) in FIG. 2.

As described above, the neutralization reaction between the strong acid SAc (compound HX) and the base Ba (compound AZ) produces the weak acid WAc (compound HZ) rather than the strong acid generator SPA (AX). The weak acid WAc (compound HZ) causes an acid-catalyzed reaction of the sensitizer precursor Pp. and the sensitizer Ps is produced from the sensitizer precursor Pp. However, unlike the strong acid SAc (compound HX), the weak acid WAc (compound HZ) does not cause a chemically amplified resist reaction such as polarity conversion of the base resin R.

Preferably, the environment surrounding the resist layer 10 is for example an atmosphere that can control decay of the acid and the radical involved in the production of the sensitizer Ps. The environment that can control decay of the acid and the radical involved in the production of the sensitizer Ps may be a basic substance-free inert gas atmosphere or a vacuum atmosphere. Additionally or alternatively, a topcoat layer that insulates basic substances and/or oxygen may be provided on the resist layer 10. In a configuration in which the environment surrounding the resist layer 10 is an inert gas atmosphere, nitrogen gas, helium gas, or argon gas is for example used as the inert gas. In such a configuration, the atmosphere may be under reduced or increased pressure. In a configuration in which the environment surrounding the resist layer 10 is a vacuum atmosphere, at least an area surrounding the resist layer 10 is under vacuum. Preferably, the area surrounding the resist layer 10 is at a vacuum of no greater than 1 Pa. In an inert gas atmosphere environment or a vacuum atmosphere environment, decay of the acid and the radical involved in the production of the sensitizer Ps in the resist layer 10 is inhibited.

In a configuration in which the sensitizer precursor Pp is of acetal type, the patterned exposure L1 is preferably performed in an atmosphere that prevents acid inactivation by setting up an exposure device in a clean room and inserting a base removal filter into the exposure device, as in the case of chemically amplified resists that are mainly used in recent semiconductor mass production processes. In a configuration in which the sensitizer precursor Pp is of alcohol type, the patterned exposure L1 is preferably performed in a vacuum or inert atmosphere that prevents acid inactivation.

The beam that can be used for the patterned exposure L1 is for example extreme ultraviolet light (EUV), an electron beam (EB), ArF excimer laser, and KrF excimer laser. A topcoat layer that insulates basic substances and/or oxygen may be provided on the resist layer 10.

Then, the flood exposure L2 is performed on the resist layer 10 as illustrated in FIG. 1C. The flood exposure L2 imparts energy to the entire resist layer 10 in which the sensitizer Ps has been produced. Preferably, a period of time of the flood exposure L2 is for example not longer than one minute, and more preferably not longer than 30 seconds.

The sensitizer Ps transitions into an excited state as a result of the flood exposure L2. As shown in FIG. 3, the strong acid generator SPA produces the strong acid SAc with use of the excited sensitizer Ps.

As a result of the energy being imparted through the flood exposure L2, the strong acid SAc is produced from the strong acid generator SPA in the regions 10a as illustrated in FIG. 4B. Even though the regions 10b, in which the sensitizer Ps is not produced, are irradiated with the beam for the flood exposure L2, neither the strong acid generator SPA nor the sensitizer precursor Pp in the regions 10b substantially reacts. Since the concentration distribution of the sensitizer Ps produced through the patterned exposure L1 is sharp as described above, the concentration distribution of the strong acid SAc produced from the strong acid generator SPA with use of the sensitizer Ps can be sharp.

The sensitizer Ps for example transitions into an excited state as a result of the flood exposure L2. The strong acid SAc is produced in the regions 10a from the strong acid generator SPA with use of the sensitizer Ps. In a configuration in which the strong acid SAc is produced from the strong acid generator SPA with use of the sensitizer Ps, electron transfer from the sensitizer Ps in the excited state to the strong acid generator SPA causes the strong acid generator SPA to be decomposed through a dissociative electrophilic addition reaction. As a result, the strong acid SAc and the sensitizer Ps that are unexcited are newly produced.

The production of the strong acid SAc and the sensitizer Ps is continued until the strong acid generator SPA and the sensitizer precursor Pp are consumed substantially completely as long as the flood exposure L2 is continued in the regions 120a including the sensitizer Ps and the strong acid generator SPA.

Typically, a beam intensity for the flood exposure L2 is higher than a beam intensity for the patterned exposure L1. The flood exposure L2 can be performed with a less costly light source than that for the patterned exposure L1. Typically, the beam that is used for the flood exposure L2 has a longer wavelength than the beam for the patterned exposure L1. However, the present invention is not limited to such a configuration. The beam that is used for the flood exposure L2 may have a shorter wavelength than the beam for the patterned exposure L1 for example in the following situation: the resist layer 10 before the patterned exposure L1 has a wavelength band A which does not include an absorption wavelength shorter than that of the beam for the patterned exposure L1, and the beam that is used for the flood exposure L2 has a wavelength, within the wavelength band A, with respect to which only the sensitizer Ps produced through the patterned exposure L1 exhibits absorption. In a configuration in which the resist layer 10 is a positive resist layer, a latent image that allows the regions 10a of the resist layer 10 to be removed is formed.

Preferably, the entire resist layer 10 is irradiated with the beam for the flood exposure L2. However, a partial area of the resist layer 10 may be irradiated with the beam for the flood exposure L2. The flood exposure L2 may be flash exposure, which is performed over a shorter period of time. For example, the flood exposure L2 may be laser flash exposure. Preferably, the period of time of the flood exposure L2 is for example not longer than one minute on an area-by-area basis, and more preferably not longer than 30 seconds.

A commonly performed treatment may be given to the resist layer 10 after the flood exposure L2 is performed. For example, a thermal treatment (post exposure bake: PEB) may be performed after the flood exposure L2. The thermal treatment may for example be pulse thermal treatment. The thermal treatment causes an acid diffusion reaction. The thermal treatment is for example performed at a temperature of at least 100° C. and no greater than 110° C. Furthermore, a modification treatment may be performed for transforming the resist layer 10 from a positive type to a negative type or vice versa after the flood exposure L2.

Then, the resist layer 10 is developed as illustrated in FIG. 1D. As a result of the developing, the regions 10a in which the strong acid SAc has been produced (regions where the latent image has been formed) are removed by being dissolved in a developing solution. Through the above, the resist layer 10 having a pattern according to a pattern shape of the patterned exposure L1 can be formed.

Desirably, the reaction that produces the sensitizer Ps from the sensitizer precursor Pp is performed at a temperature lower than or equal to room temperature. However, as necessary, the temperature may be raised to a temperature slightly higher than room temperature after the patterned exposure L1 in order to achieve higher sensitivity while compromising resolution.

Through the above, a resist pattern can be formed in the resist layer 10.

In a situation in which a modification treatment is performed on the resist layer 10 after the flood exposure L2 as described above, the modification treatment may be performed when a rinse liquid is used in a latter half of the development process. For example, the use of a silicon-containing rinse liquid may cause silicon impregnation of the regions 10a of the resist layer 10 to which energy has been imparted through the patterned exposure L1. In such a situation, development by dry etching may remove the regions 10b without removing the regions 10a.

In general, for forming a positive resist layer, the resist layer is subjected to patterned exposure and flood exposure, and then is developed with an aqueous alkaline solution to be formed into a positive resist layer pattern. However, the resist layer may be formed into a negative resist layer pattern through development using an organic solvent instead of the aqueous alkaline solution.

The resist material according to the present embodiment includes a resist composition containing the base resin R, the sensitizer precursor Pp, the strong acid generator SPA, and the base Ba. When the resist composition in the resist material according to the present embodiment is irradiated with the beam for the patterned exposure L1, the sensitizer Ps that exhibits significant absorption with respect to a beam having a different wavelength from the wavelength of the beam for the patterned exposure L1 is produced from the sensitizer precursor Pp. The sensitizer Ps is produced in a pattern shape in accordance with the irradiation with the beam for the patterned exposure L1. Upon irradiation with the beam for the flood exposure L2, the sensitizer Ps absorbs the beam for the flood exposure L2 to cause a reaction. For example, the strong acid SAc is produced from the strong acid generator SPA with use of the sensitizer Ps, and thus a predetermined latent image pattern can be readily formed.

According to the present embodiment, both the strong acid SAc and the weak acid WAc react with the sensitizer precursor Pp to produce the sensitizer Ps as represented by the reaction formula (2) and the reaction formula (3b) in FIG. 2. However, only the strong acid SAc contributes to a resist reaction such as a polarity conversion reaction of the resin. Thus, the problematic photon shot noise, which accompanies resolution improvement in a sensitized and chemically amplified resist, can be solved.

According to the present embodiment, the flood exposure L2 is performed to excite the sensitizer Ps to cause production of the strong acid SAc from the strong acid generator SPA after the patterned exposure L1 is performed to cause production of the sensitizer Ps in the regions 10a of the resist layer 10. Even if a low-power light source is used as a light source of the beam for the patterned exposure L1, therefore, a latent image in an adequate pattern shape can be formed. For example, a latent image can be formed in the regions 10a of the resist layer 10 by irradiating the regions 10a using an EUV beam as the beam for the patterned exposure L1, and subsequently irradiating the resist layer 10 using a UV beam as the beam for the flood exposure L2. In such a case, high throughput can be achieved even with a low-power light source because the time of the EUV irradiation can be shortened.

Furthermore, according to the present embodiment, the strong acid SAc is produced in the regions 10a of the resist layer 10, whereas the base Ba is present in the entire resist layer 10. Consequently, the strong acid SAc is present in the regions 10a and the base Ba is present in the regions 10b at room temperature before the PEB even though the strong acid SAc in the regions 10a is reduced as a result of a portion thereof being neutralized with the base Ba. Reduction in resolution due to temperature rise and diffusion of the strong acid SAc as a result of the PEB can be inhibited by the base Ba that is present in the regions 10b.

Note that a large chemical gradient magnitude can be obtained through a reaction after the PEB when the strong acid SAc and the base Ba have a low diffusion coefficient at a PEB temperature. The LWR is inversely proportional to the chemical gradient magnitude. Likewise, the LWR due to photon shot noise is inversely proportional to the chemical gradient magnitude. According to the above-described process, therefore, the LWR due to photon shot noise can be significantly reduced.

This relationship is well known and formulated as shown below.

$$LWR \propto constant / dm/dx$$

$$\sigma_{LWR} \theta \sigma_m / dm/dx$$

In the formulae, σ represents standard deviation value, m represents concentration of a chemical substance after reaction that is normalized to the substance concentration before reaction, x represents position of the resist layer, and dm/dx represents chemical gradient. Reaction variability increases and therefore $\sigma_m$ increases with a decrease in the number of photons. Since a very large chemical gradient dm/dx can be obtained according to the present embodiment, the standard deviation value of the LWR can be reduced even if $\sigma_m$ is large.

Thus, according to the present embodiment, the trade-off between the sensitivity, the resolution, and the line width roughness (LWR) can be solved, and therefore the sensitivity of the resist layer 10 can be increased while maintaining the pattern resolution. Furthermore, according to the present embodiment, photon shot noise, which has recently been considered a bigger problem than the trade-off, can be significantly improved. As a result, the throughput in the exposure process can be improved, and significant cost reduction for the exposure system can be achieved. Furthermore, since a low-power light source can be used, the lives of consumable parts of the light source device and the exposure device can be extended, and the maintenance cost and the operation cost can be significantly reduced. As described above, the present embodiment can reduce the LWR due to photon shot noise and improve the resist sensitivity while solving the trade-off between the sensitivity, the resolution, and the line width roughness (LWR).

Furthermore, according to the present embodiment, the resist layer 10 is basic because of the base Ba contained therein. Accordingly, decomposition of the sensitizer precursor Pp can be inhibited, and a minor concentration of acid can be avoided, which is produced in the regions 10b by out-of-band light when EUV is used for the patterned exposure L1.

Preferably, a polyhydroxystyrene resin (PHS resin) or the like is used as the base resin R together with the sensitizer precursor Pp such as the propargyl alcohol in the resist material according to the present embodiment. The PHS resin generally has a high glass transition point Tg and thus tends to inhibit acid diffusion. Furthermore, the sensitizer precursor Pp such as the propargyl alcohol is also reactive with a weak acid.

The following reaction is for example expected to occur in the resist layer 10 in response to the flood exposure L2. Upon the flood exposure L2, the sensitizer Ps is excited to be in an excited state (Ps→Ps*). The excited sensitizer Ps* reacts with the strong acid generator SPA to produce the strong acid SAc. More specifically, electron transfer from the excited sensitizer Ps* to the strong acid generator SPA occurs, and the strong acid generator SPA receives an electron to produce X⁻. As a result, the strong acid SAc (HX) is produced.

According to some embodiments, a cationic radical (Ps·⁺) of the sensitizer returns to the sensitizer Ps through hole transport therefrom to high molecules of the base resin R.

According to some embodiments, proton transport from the cationic radical (Ps·⁺) of the sensitizer to high molecules of the base resin R occurs. Preferably, the absorption spectrum of the sensitizer Ps remains unchanged after such a reaction, that is, the absorption spectrum of the sensitizer Ps does not change during the flood exposure L2.

As described above, the strong acid SAc reacts with the sensitizer precursor Pp to produce the sensitizer Ps through the patterned exposure L1 as represented by the reaction formula (2) in FIG. 2. The strong acid SAc may react with the sensitizer precursor Pp to further produce the sensitizer Ps through the flood exposure L2. Preferably, however, the production of the sensitizer Ps from the sensitizer precursor Pp is promoted by the patterned exposure L1 but is not promoted by the flood exposure L2.

As described above, the flood exposure L2 is preferably flash exposure, which is performed over a short period of time. In the case where the sensitizer Ps is further produced by the flood exposure L2, the sensitizer Ps further produced may cause unintended production of the strong acid SAc. As a result of the flood exposure L2 being performed over a short period of time, unintended production of the strong acid SAc can be inhibited.

The reaction between the weak acid WAc and the sensitizer precursor Pp represented by the reaction formula (3b) in FIG. 2 may be a reaction that does not proceed well at room temperature but proceeds in a heated environment. In such a case, heating (PEB) is preferably performed during the patterned exposure L1 in order to allow the reaction represented by the reaction formula (3b) to proceed during the patterned exposure L1. Although heating performed after the patterned exposure L1 promotes the reaction between the weak acid WAc and the sensitizer precursor Pp to produce the sensitizer Ps, it is not desired that the strong acid SAc and the weak acid WAc diffuse during the PEB after the patterned exposure L1. Preferably, the temperature of the heating (PEB) after the patterned exposure L1 is lower than the temperature of the heating (PEB) after the flood exposure L2.

In the description given above, the resist composition in the resist layer 10 contains the base Ba, and the base Ba reacts with the strong acid SAc to produce the neutralant Ne and the weak acid WAc. However, the present invention is not limited to such a configuration. The resist composition may contain a weak base weaker than the base Ba in addition to the base Ba. In such a case, the weak base contained in the resist composition prevents the weak acid WAc produced through the neutralization of the strong acid SAc with the base Ba from diffusing out of an edge of an area of the patterned exposure L1.

As mentioned above, the sensitizer Ps may be produced from the sensitizer precursor Pp through a reaction between the sensitizer precursor Pp and the strong acid SAc produced from the strong acid generator SPA through the patterned exposure L1. In such a case, a process 1 may be performed in which the sensitizer Ps is produced through a reaction between the sensitizer precursor Pp and the strong acid SAc as a result of the patterned exposure L1, and subsequently a process 2 may be performed in which the excited sensitizer Ps reacts with the strong acid generator SPA as a result of the flood exposure L2.

In the process 1, the sensitizer Ps is produced through a reaction between the sensitizer precursor Pp and the strong acid SAc as a result of the patterned exposure L1. Typically, the strong acid SAc diffuses in the resist layer and reacts with the sensitizer precursor Pp that is present around the diffusing strong acid SAc, so that the sensitizer Ps is produced from the strong acid SAc and the sensitizer precursor Pp. That is, the process 1 proceeds through diffusion of the strong acid SAc. The diffusion length varies greatly depending on base concentration, acid molecule size, temperature, resist glass transition point Tg, and the like. In general, the diffusion length of the strong acid SAc increases with an increase in temperature. For example, the diffusion length of the strong acid SAc is relatively long at a temperature higher than the glass transition point Tg of the base resin. As described above, the process 1 is a reaction associated with thermal diffusion of the strong acid SAc. That is, the reaction between the strong acid SAc and the sensitizer precursor Pp can occur even at a point distant from a point at which the strong acid SAc has been produced.

In the process 2, typically, the exited sensitizer Ps reacts with the strong acid generator SPA to produce the strong acid SAc. That is, the process 2 is a photochemical reaction that causes transfer such as electron transfer or energy transfer. This reaction is three-dimensional and highly isotropic, and occurs at a relatively short distance from the excited sensitizer Ps.

Hereinafter, roughness and photon shot noise in the process 1 and the process 2 will be discussed. In a configuration in which the reaction is caused to proceed using a small amount of photons, in particular, roughness due to photon shot noise may be noticeable. In order to reduce roughness due to photon shot noise, the reaction distance is preferably short both in the process 1 and in the process 2. The reaction distance varies more in the process 1, which is associated with the thermal diffusion, than in the process 2. In a configuration in which the concentration of the strong acid SAc is relatively low, in particular, the reaction in the process 1 tends to result in roughness due to photon shot noise associated with the diffusion. In order to reduce roughness due to photon shot noise, therefore, the diffusion length of the strong acid SAc is preferably adjusted to be relatively short by reducing the temperature, so long as the reaction that produces the sensitizer Ps from the strong acid SAc and the sensitizer precursor Pp proceeds efficiently in the process 1. Preferably, the patterned exposure L is for example performed in view of temperature dependency of the diffusion of the strong acid SAc, the temperature dependency of the reaction that produces the sensitizer Ps from the strong acid SAc and the sensitizer precursor Pp, and the like.

In the process 2, it is preferable that the excited sensitizer Ps and the strong acid generator SPA are selected so that the strong acid SAc is produced efficiently through the three-dimensional and highly isotropic electron transfer or energy transfer from the exited sensitizer Ps to the strong acid generator SPA and that the concentration of the strong acid generator SPA is high. Furthermore, it is effective for reducing roughness and photon shot noise-induced roughness that the proportion of the process 2 is larger than the proportion of the process 1. As described above, it is preferable that in the patterned exposure L1 and the flood exposure L2, the diffusion distance of the strong acid SAc in the reaction between the strong acid SAc and the sensitizer precursor Pp is short, and the reaction distance of the electron transfer or the energy transfer from the exited sensitizer Ps to the strong acid generator SPA is short. Furthermore, it is preferable that contribution of the reaction that produces the strong acid SAc using the three-dimensional and highly isotropic electron transfer or energy transfer is greater than contribution of the reaction depending on random diffusion paths of the strong acid SAc and the like. Thus, roughness due to photon shot noise in a resultant resist pattern can be reduced.

As mentioned above, in a configuration in which the sensitizer Ps is produced from the sensitizer precursor Pp through a reaction between the sensitizer precursor Pp and the strong acid SAc produced from the strong acid generator SPA through the patterned exposure L1, the sensitizer precursor Pp preferably not only functions as a reactant for producing the sensitizer Ps but also has sensitizing action on the reaction that produces the strong acid SAc from the strong acid generator SPA. Preferably, in the patterned exposure L1, the sensitizer precursor Pp has either or both of sensitizing action on the reaction that produces the sensitizer Ps from the sensitizer precursor Pp and sensitizing action on the reaction that produces the strong acid SAc from the strong acid generator SPA.

In the description given above, the patterned exposure L1 and the flood exposure L2 are each performed once. However, the present invention is not limited to such a configuration. The patterned exposure L and the flood exposure L2 may be each performed two or more times. For example, the flood exposure L2 may be performed two or more times.

In the description given above, the strong acid SAc produced from the strong acid generator SPA through the patterned exposure L1 reacts with the sensitizer precursor Pp to produce the sensitizer Ps, and the resist layer 10 contains the base Ba for neutralization of the strong acid SAc before the patterned exposure L1 is performed. However, the present invention is not limited to such a configuration. The resist layer 10 may produce the sensitizer Ps from the sensitizer precursor Pp with use of a radical produced through the patterned exposure L1, and the resist layer 10 may contain a radical scavenger component Rk before the patterned exposure L is performed.

The following describes a resist patterning method and a resist material according to an embodiment of the present invention with reference to FIGS. 5A to 5D. The resist patterning method and the resist material according to the present embodiment are similar to the resist patterning method and the resist material described with reference to FIGS. 1A to 1D and 2 except that the resist layer 10 contains the radical scavenger component Rk before the patterned exposure L1 is performed. Accordingly, redundant description thereof is omitted in order to avoid repetition. In the present embodiment, the sensitizer precursor Pp in the resist layer 10 is of alcohol type, and the sensitizer Ps is produced from the sensitizer precursor Pp with use of the radical produced through the patterned exposure L1.

FIGS. 5A to 5D are schematic diagrams each illustrating a process of the resist patterning method according to the present embodiment.

Figure 5A:
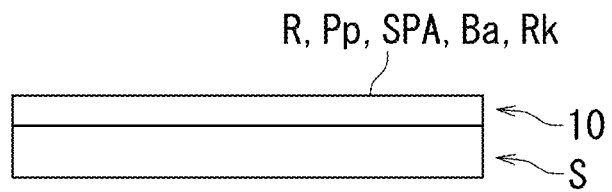
FIGS. 5A to 5D are schematic diagrams each illustrating a process of a resist patterning method according to an embodiment of the present invention.

First, the resist layer 10 is formed on the substrate S as illustrated in FIG. 5A. The resist layer 10 contains the base resin R, the sensitizer precursor Pp, the strong acid generator SPA, the base Ba, and the radical scavenger component Rk.

A radical scavenger such as hindered phenol or a radical inhibitor is for example used as the radical scavenger component Rk. The radical scavenger component Rk may be mixed in the base resin R. Alternatively, the radical scavenger component Rk may be bound to another component of the resist layer 10. The radical scavenger component Rk is for example bound to the base resin R. In a configuration in which a polyhydroxystyrene resin (PHS resin) is used as the base resin R, the PHS resin can function as the radical scavenger.

Figure 5B:
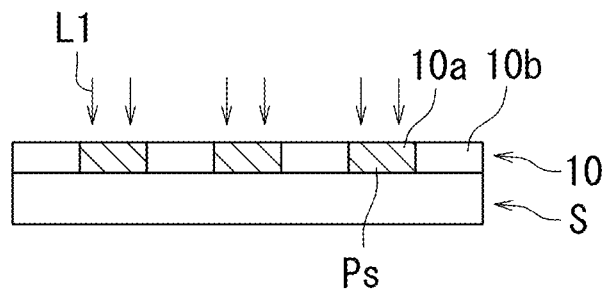

Next, the patterned exposure L1 is performed on the resist layer 10 as illustrated in FIG. 5B. The regions 10a of the resist layer 10 are irradiated with the beam for the patterned exposure L1, but the regions 10b of the resist layer 10 are not irradiated with the beam for the patterned exposure L1.

Before the patterned exposure L1 is performed, the strong acid generator SPA, the sensitizer precursor Pp, the base Ba, and the radical scavenger component Rk each have a concentration that is substantially constant throughout the resist layer 10 regardless of location. The concentration of the radical scavenger component Rk is relatively low compared to the concentrations of the strong acid generator SPA and the sensitizer precursor Pp.

Once the patterned exposure L1 is started, a radical is produced in the regions 10a, and the sensitizer Ps is produced from the sensitizer precursor Pp with use of the radical. Since the resist layer 10 contains the radical scavenger component Rk in the present embodiment, a portion of the produced radical is scavenged by the radical scavenger component Rk. Accordingly, the concentration distribution of the sensitizer Ps is sharp compared to that in the embodiments in which the resist layer 10 contains no radical scavenger component Rk.

Figure 5C:
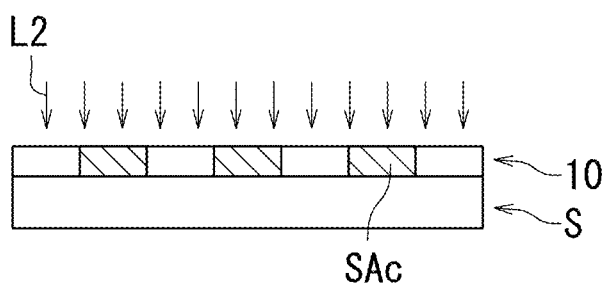

Next, the flood exposure L2 is performed on the resist layer 10 as illustrated in FIG. 5C. Since the concentration distribution of the sensitizer Ps produced through the patterned exposure L1 is sharp, the concentration distribution of the strong acid SAc produced from the strong acid generator SPA with use of the sensitizer Ps can be sharp.

Figure 5D:
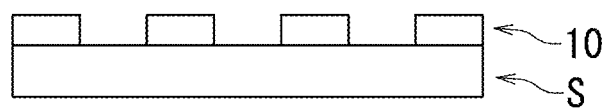

Then, the resist layer 10 is developed as illustrated in FIG. 5D. As described above, adding in advance a small amount of the radical scavenger component Rk to the resist layer 10 enables an improvement in contrast and resolution, inhibition of production of a small amount of acid as a result of the regions 10b being irradiated with stray light or out-of-band light, and an improvement in resist performance.

Furthermore, the resist layer 10 may contain a radical generating component that is different from the strong acid generator SPA as mentioned above. Alternatively, the resist layer 10 may contain a radical generating component that is the same material as the strong acid generator SPA. In such a case, the flood exposure L2 causes production of the strong acid SAc and production of the sensitizer Ps. This reaction includes a reaction associated with a radical, and therefore the resist layer 10 preferably contains the radical scavenger component Rk as described above. Furthermore, the resist layer 10 may contain a radical inhibitor generator that generates a radical scavenger component through exposure to light (for example, flood exposure).

In the description given above with reference to FIGS. 1A to 5D, the resist layer 10 is uncovered and in a direct contact with the external atmosphere. However, the present invention is not limited to such a configuration. The surface of the resist layer 10 may be provided with a topcoat layer. Furthermore, an underlayer may be provided between the resist layer 10 and the substrate S.

The following describes a resist patterning method according to an embodiment of the present invention with reference to FIGS. 6A to 6D. The resist patterning method according to the present embodiment is similar to the resist patterning method described above with reference to FIGS. 1A to 5D except that an underlayer U is further formed underneath the resist layer 10, and a topcoat layer T is further formed on top of the surface of the resist layer 10. Accordingly, redundant description thereof is omitted in order to avoid repetition.

Figure 6A:
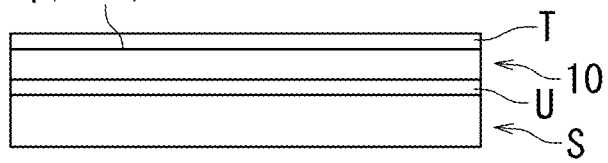
FIGS. 6A to 6D are schematic diagrams each illustrating a process of a resist patterning method according to an embodiment of the present invention.

First, the underlayer U is formed on the substrate S as illustrated in FIG. 6A. The underlayer is for example formed from a commercially available inorganic material or organic material.

Next, the resist layer 10 is formed on the underlayer U. The resist layer 10 contains the base resin R, the sensitizer precursor Pp, the strong acid generator SPA, and the base Ba.

Next, the topcoat layer T is formed on the surface of the resist layer 10. The topcoat layer T blocks basic substances and/or oxygen from entering the resist layer 10. Preferably, the topcoat layer T transmits the beams for the patterned exposure L1 and the flood exposure L2, and blocks as many of out-of-band light beams as possible.

In a configuration in which the sensitizer precursor Pp is of acetal type, for example, the topcoat layer T is preferably impervious to basic compounds in order to prevent acid inactivation. In a configuration in which the sensitizer precursor Pp is of alcohol type, for example, the topcoat layer T is formed from a non-oxygen-permeable cross-linked polymer film or a polymer film containing an oxygen-reactive substance such as hydroquinone or 3,5-dibutyl-4-hydroxytoluene. The thickness of the topcoat layer T is determined according to a beam source for the patterned exposure L1. In a configuration in which EUV is used for the beam source, for example, the topcoat layer T preferably has a thickness of at least 20 nm and no greater than 50 nm because large energy loss of the EUV is expected at the topcoat layer T. Furthermore, in a configuration in which an EB is used for the beam source, the topcoat layer T preferably has a thickness of no greater than 50 nm, although the thickness depends on the energy of the EB. Furthermore, in a configuration in which ArF or KrF is used for the beam source, the topcoat layer T is preferably transparent to the beam, and the topcoat layer T may have a thickness of at least 20 nm and no greater than 200 nm.

Figure 6B:
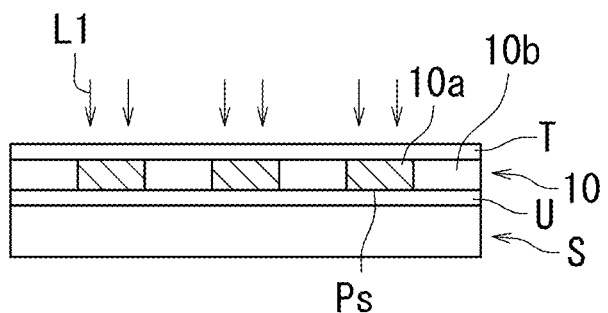

Next, the patterned exposure L1 is performed on the resist layer 10 through the topcoat layer T as illustrated in FIG. 6B. As described above, the sensitizer Ps is formed in the regions 10a through the patterned exposure L1.

Figure 6C:
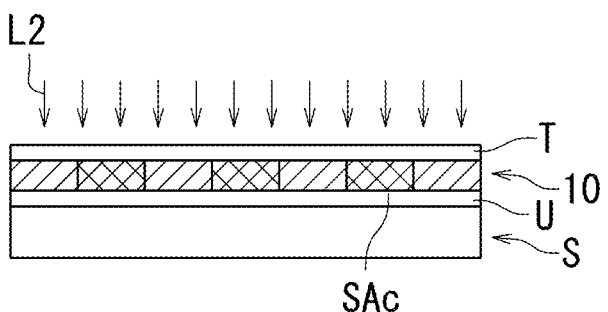

Next, the flood exposure L2 is performed on the resist layer 10 through the topcoat layer T as illustrated in FIG. 6C. As described above, the strong acid SAc is formed in the regions 10a through the flood exposure L2.

Figure 6D:
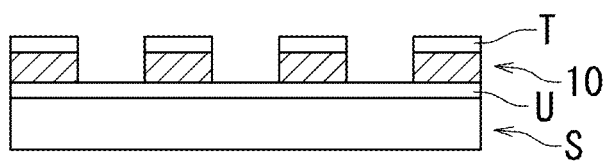

Next, the resist layer 10 is developed as illustrated in FIG. 6D. As a result of the developing, the regions 10a in which the strong acid SAc has been produced (regions where the latent image has been formed) are removed by being dissolved in a developing solution. Through the above, the resist layer 10 having a pattern according to a pattern shape of the patterned exposure L1 can be formed. The topcoat layer T on the resist layer 10 may be removed as necessary after the patterned exposure L1 or after the flood exposure L2. During the patterned exposure L or during the flood exposure L2, the topcoat layer T provided as described above inhibits unintended entrance of basic substances and/or the radical scavenger component into the resist layer 10. Thus, the resist performance of the resist layer 10 can be further improved.

In the description given above with reference to FIGS. 6A to 6D, the topcoat layer T is provided on top of the resist layer 10, and the underlayer U is provided underneath the resist layer 10. However, the present invention is not limited to such a configuration. The underlayer U may be disposed underneath the resist layer 10 without the topcoat layer T being provided. Alternatively, the topcoat layer T may be provided on top of the resist layer 10 without the underlayer U being provided.

Furthermore, the underlayer U preferably functions as an anti-reflection film for the beam for the flood exposure L2.

The most suitable thickness of the underlayer U is determined according to the wavelength of the flood exposure L2.

In the description given above, the base Ba is present in the resist layer 10 before the light exposure performed as the patterned exposure L1, and the amount of the base Ba decreases as the strong acid SAc is produced in the resist layer 10. However, the present invention is not limited to such a configuration. The resist layer 10 may contain a base generator PBG.

The following describes a resist patterning method and a resist material according to an embodiment of the present invention with reference to FIGS. 7A to 7D and 8A to 8B. The resist patterning method and the resist material according to the present embodiment are similar to the resist patterning method and the resist material described above with reference to FIGS. 1A to 6D except that the resist layer 10 contains the base generator PBG before the patterned exposure L1 is performed. Accordingly, redundant description thereof is omitted in order to avoid repetition.

First, the resist layer 10 is formed on the substrate S as illustrated in FIG. 7A. The resist layer 10 contains the base resin R, the sensitizer precursor Pp, the strong acid generator SPA, and the base generator PBG. In the resist layer 10, for example, the base generator PBG is contained in an amount of greater than 0 parts by mass and no greater than 40 parts by mass relative to 100 parts by mass of the base resin R.

The base generator PBG may be of nonionic type or ionic type. The base generator PBG of nonionic type is for example 9-anthrylmethyl N,N-diethylcarbamate. The base generator PBG of ionic type is for example cyclohexylammonium 2-(3-benzoylphenyl) propionate or dicyclohexylammonium 2-(3-benzoylphenyl) propionate. The base Ba produced from the base generator PBG preferably has a low diffusion coefficient.

Next, the patterned exposure L1 is performed on the resist layer 10 as illustrated in FIG. 7B. The regions 10a of the resist layer 10 are irradiated with the beam for the patterned exposure L1, but the regions 10b of the resist layer 10 are not irradiated with the beam for the patterned exposure L1.

The patterned exposure L1 imparts energy to the regions 10a of the resist layer 10, and as a result, the sensitizer Ps is produced from the sensitizer precursor Pp. FIG. 8A illustrates concentration distribution of the sensitizer Ps in one region 10a.

Then, the flood exposure L2 is performed on the resist layer 10 as illustrated in FIG. 7C. The flood exposure L2 imparts energy to the entire resist layer 10 in which the sensitizer Ps has been produced.

A base Ba1 is produced from the base generator PBG through the flood exposure L2. The base Ba1 may be the same as or different from the base Ba pre-contained in the resist layer 10. According to the present embodiment, the base Ba1 is produced from the base generator PBG in the regions 10b through the flood exposure L2 as illustrated in FIG. 8B. The base Ba1 produced from the base generator PBG in the regions 10a reacts with the strong acid SAc, and thus the concentration of the strong acid SAc in the regions 10a is reduced.

In general, the strong acid SAc and the base Ba1 have a very low diffusion coefficient at room temperature. Accordingly, the peak concentration of the strong acid SAc and the peak concentration of the base Ba1 are each substantially constant. The concentration of the strong acid SAc and the concentration of the base Ba1 exhibit very steep gradients at boundaries between the regions 10a and the regions 10b.

In the description given above with reference to FIGS. 7A to 7D and 8A to 8B, the base Ba1 is produced from the base generator PBG through the flood exposure L2. However, the present invention is not limited to such a configuration. The base Ba1 may be produced from the base generator PBG also through the patterned exposure L1 as well as through the flood exposure L2.

The following describes a resist patterning method and a resist material according to an embodiment of the present invention with reference to FIGS. 9A to 9E. The resist patterning method according to the present embodiment is similar to the resist patterning method and the resist material described above with reference to FIGS. 7A to 7D and 8A to 8B except that the flood exposure is performed twice. Accordingly, redundant description thereof is omitted in order to avoid repetition.

FIGS. 9A to 9E are schematic diagrams each illustrating a process of the resist patterning method according to the present embodiment.

Figure 9A:
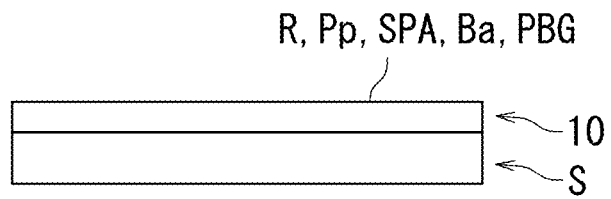
FIGS. 9A to 9E are schematic diagrams each illustrating a process of a resist patterning method according to an embodiment of the present invention.
Figure 9B:
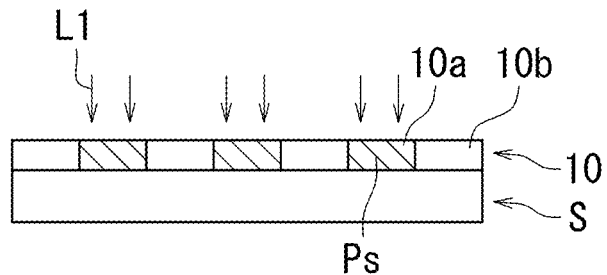

First, the resist layer 10 is formed on the substrate S as illustrated in FIG. 9A. The resist layer 10 contains the base resin R, the sensitizer precursor Pp, the strong acid generator SPA, the base Ba, and the base generator PBG Next, the patterned exposure L1 is performed on the resist layer 10 as illustrated in FIG. 9B. The regions 10a of the resist layer 10 are irradiated with the beam for the patterned exposure L1, but the regions 10b of the resist layer 10 are not irradiated with the beam for the patterned exposure L1. As a result of the regions 10a of the resist layer 10 being irradiated with the beam through the patterned exposure L1, the sensitizer Ps is produced from the sensitizer precursor Pp in the regions 10a.

Figure 9C:
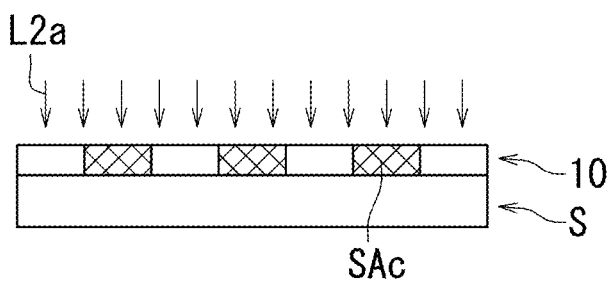

Then, first flood exposure L2a is performed on the resist layer 10 as illustrated in FIG. 9C. As a result of the entire resist layer 10 being irradiated with a beam through the first flood exposure L2a, the strong acid SAc is produced from the strong acid generator SPA with use of the sensitizer Ps. In the case where the production of the strong acid SAc is continued until the strong acid generator SPA has been completely consumed, the strong acid SAc is no longer produced thereafter, and therefore the strong acid SAc exhibits a peak concentration that is substantially constant over the entirety of each region 10a. Eventually, the concentration distribution of the strong acid SAc exhibits very sharp changes at boundaries between the regions 10a and the regions 10b.

Figure 9D:
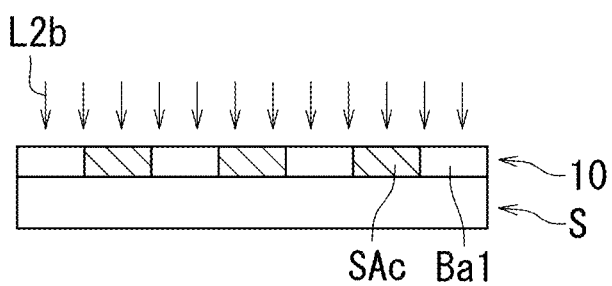

Then, second flood exposure L2b is performed on the resist layer 10 as illustrated in FIG. 9D. As a result of the entire resist layer 10 being irradiated with a beam through the second flood exposure L2b, the base Ba1 is produced from the base generator PBG The following describes production of the base Ba1 from the base generator PBG. Before the second flood exposure L2b is performed, the base generator PBG is distributed in the resist layer 10 substantially uniformly. Once the second flood exposure L2b is started, the base generator PBG in the regions 10b is reduced as the base Ba1 is produced from the base generator PBG. The base Ba1 is produced from the base generator PBG also in the regions 10a. However, the base Ba1 produced in the regions 10a is neutralized with the strong acid SAc, and thus the concentration of the strong acid SAc therein is reduced.

As the second flood exposure L2b is further continued, the base generator PBG in the regions 10b is further reduced. Accordingly, the concentration of the base Ba1 produced from the base generator PBG increases. The second flood exposure L2b is for example continued until the base generator PBG in the regions 10b has been consumed completely.

The base Ba1 produced from the base generator PBG in the regions 10a reacts with the strong acid SAc, and thus the concentration of the strong acid SAc in the regions 10a is reduced. The peak concentration of the strong acid SAc and the peak concentration of a sum of the base Ba and the base Ba1 are each substantially constant. The concentration of the strong acid SAc and the concentration of the sum of the base Ba and the base Ba1 exhibit very sharp changes at boundaries between the regions 10a and the regions 10b. Accordingly, a very large chemical gradient magnitude is obtained after the PEB. The LWR due to photon shot noise is inversely proportional to the chemical gradient magnitude. The LWR due to photon shot noise can therefore be significantly reduced.

Figure 9E:
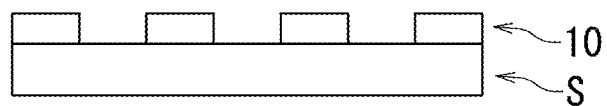

Then, the resist layer 10 is developed as illustrated in FIG. 9E. As a result of the developing, the regions 10a in which the strong acid SAc has been produced are removed. Through the above, the resist layer 10 having a pattern according to a pattern shape of the patterned exposure L1 can be formed.

In the description given above with reference to FIGS. 9A to 9E, the second flood exposure L2b is continued until the base generator PBG in the regions 10b has been consumed completely. However, the present invention is not limited to such a configuration. The second flood exposure L2b does not need to be continued until the base generator PBG in the regions 10b has been consumed completely.

Furthermore, in the description given above with reference to FIGS. 9A to 9E, a reaction that produces the base Ba1 from the base generator PBG is not promoted by the first flood exposure L2a but is promoted by the second flood exposure L2b. This reaction is for example promoted under the following conditions.

Figure 10:
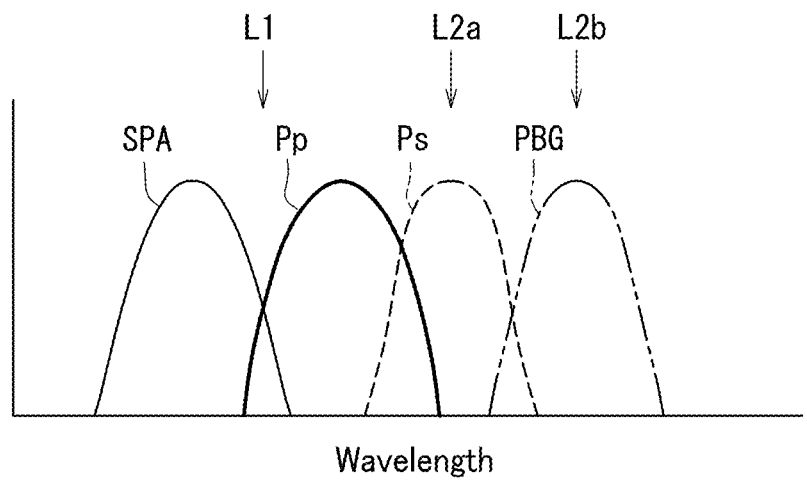
FIG. 10 shows schematic absorption wavelength spectra of a sensitizer precursor, a sensitizer, and a base generator according to an embodiment of the present invention.

FIG. 10 shows schematic absorption wavelength spectra of the sensitizer precursor Pp, the sensitizer Ps, and the base generator PBG The sensitizer Ps exhibits longer absorption wavelengths than the sensitizer precursor Pp. The base generator PBG exhibits longer absorption wavelengths than the sensitizer Ps.

In such a configuration, the patterned exposure L1 involving irradiation with a beam having a relatively short wavelength causes production of the strong acid SAc from the strong acid generator SPA and production of the sensitizer Ps from the strong acid SAc and the sensitizer precursor Pp. Furthermore, the first flood exposure L2a involving irradiation with a beam having a longer wavelength than the beam for the patterned exposure L1 causes production of the strong acid SAc from the strong acid generator SPA with use of the sensitizer Ps. Furthermore, the second flood exposure L2b involving irradiation with a beam having a longer wavelength than the beam for the first flood exposure L2a causes production of the base Ba1 from the base generator PBG The schematic absorption wavelength spectra in the embodiment in which the flood exposure is performed twice have been described with reference to FIG. 10. However, the flood exposure may be performed three or more times. Alternatively, the flood exposure may be performed once as described above with reference to FIGS. 7A to 7D and 8A to 8B.

The sensitizer precursor Pp may be of acetal type or alcohol type. Alternatively, the sensitizer precursor Pp may be a mixture of an acetal-type sensitizer precursor and an alcohol-type sensitizer precursor. In a configuration in which the sensitizer precursor Pp is of acetal type, for example, the strong acid SAc produced from the strong acid generator SPA functions as a catalyst to promote production of the sensitizer Ps from the sensitizer precursor Pp. Alternatively, in a configuration in which the sensitizer precursor Pp is of alcohol type, the resist layer 10 contains a radical generating component, and the sensitizer Ps is produced from the sensitizer precursor Pp with use of a radical that is produced.

In the description given above with reference to FIGS. 9A to 9E and 10, the base Ba1 is produced from the base generator PBG through the second flood exposure L2b. However, the present invention is not limited to such a configuration. The base Ba1 may be produced from the base generator PBG also through the patterned exposure L1 and/or the first flood exposure L2a as well as through the second flood exposure L2b. In the description given above with reference to FIGS. 9A to 9E and 10, the first flood exposure L2a and the second flood exposure L2b are performed as the flood exposure. However, the present invention is not limited to such a configuration. Third flood exposure for causing production of the strong acid SAc from the strong acid generator SPA with use of the sensitizer Ps may be performed after the second flood exposure L2b.

As mentioned above, the sensitizer Ps may be produced directly from the sensitizer precursor Pp through the patterned exposure L1. For example, the sensitizer Ps having different absorption wavelengths or absorption coefficient may be produced through structural transformation of the sensitizer precursor Pp that is excited or ionized through the patterned exposure L1. The structural transformation is for example conjugation length change, decomposition, or cis-trans isomerization. Alternatively, the sensitizer Ps may be produced through a reaction between the sensitizer precursor Pp and an electron generated from a substance contained in the resist layer 10 that is ionized through the patterned exposure L1. Alternatively, through the patterned exposure L1, the sensitizer Ps may be produced from the sensitizer precursor Pp through a reaction between the sensitizer precursor Pp and the strong acid SAc produced from the strong acid generator SPA.

In the description given above with reference to FIGS. 7A to 10, the base Ba1 is produced from the base generator PBG through the flood exposure L2. However, the present invention is not limited to such a configuration. The base Ba1 may be produced from the base generator PBG through a thermal treatment.

The patterned exposure and the flood exposure in the above-described resist patterning method are suitably performed in a latent resist image forming device. The following describes a latent resist image forming device 200 with reference to FIG. 11.

The latent resist image forming device 200 includes a patterned exposure device 210 and a flood exposure device 220. The patterned exposure device 210 performs the patterned exposure on the resist layer 10 formed on the substrate S. As described above, the resist layer 10 contains a base resin, a sensitizer precursor, a strong acid generator, and a base. The resist layer 10 may be formed directly on the substrate S or formed on another layer on the substrate S. The patterned exposure L1 performed by the patterned exposure device 210 causes production of a sensitizer from the sensitizer precursor in the resist layer 10. Next, the flood exposure device 220 performs the flood exposure L2 on the resist layer 10 to form a latent pattern image. The flood exposure L2 performed by the flood exposure device 220 causes production of an acid from the strong acid generator with use of the sensitizer.

The patterned exposure device 210 includes a chamber 212 and a patterned exposure light source 214. The chamber 212 can accommodate the resist layer 10 formed on the substrate S. Preferably, the atmosphere inside the chamber 212 is an inert gas atmosphere, an active gas atmosphere, or a vacuum atmosphere. The active gas atmosphere for example includes hydrogen gas having a controlled partial pressure. Preferably, the chamber 212 is capable of controlling the temperature of the substrate S therein in a range of from −10° C. to 100° C.

The patterned exposure light source 214 emits a beam in a pattern shape to the resist layer 10 in the chamber 212. The beam from the patterned exposure light source 214 is electromagnetic waves such as visible light, UV, DUV, and EUV. Alternatively, the beam from the patterned exposure light source 214 may be an electron beam or an ion beam. The patterned exposure light source 214 for example includes an ion beam irradiation section, an electron beam irradiation section, or an electromagnetic wave irradiation section.

In a configuration in which an EUV light source is used as the light source for the patterned exposure L1, the EUV preferably has a wavelength of at least 1 nm and no greater than 13.5 nm, and more preferably at least 6 nm and no greater than 13.5 nm. Alternatively, in a configuration in which an electron beam is used as the beam for the patterned exposure L1, the electron beam preferably has an acceleration energy of at least 10 keV and no greater than 300 keV, and more preferably at least 40 keV and no greater than 130 keV.

In the present embodiment, the substrate S is conveyed from the patterned exposure device 210 to the flood exposure device 220 after the patterned exposure device 210 performs the patterned exposure on the resist layer 10 formed on the substrate S. While the substrate S is being conveyed from the patterned exposure device 210 to the flood exposure device 220, the atmosphere inside the latent resist image forming device 200 is preferably an inert gas atmosphere, an active gas atmosphere, or a vacuum atmosphere. In order to prevent acid inactivation during the period from the patterned exposure to the PEB, it is preferable to tightly control the atmosphere in the latent resist image forming device 200 using a basic compound removal filter or the like. Thus, decay of the activity of the resist layer 10 that is engendered by the patterned exposure device 210 can be inhibited. Preferably, the chamber 222 is capable of controlling the temperature of the substrate S therein in a range of from −10° C. to 100° C.

The flood exposure device 220 has a chamber 222 and a flood exposure light source 224. The chamber 222 can accommodate the resist layer 10 formed on the substrate S. Preferably, the atmosphere inside the chamber 222 is an inert gas atmosphere, an active gas atmosphere, or a vacuum atmosphere.

Figure 11:
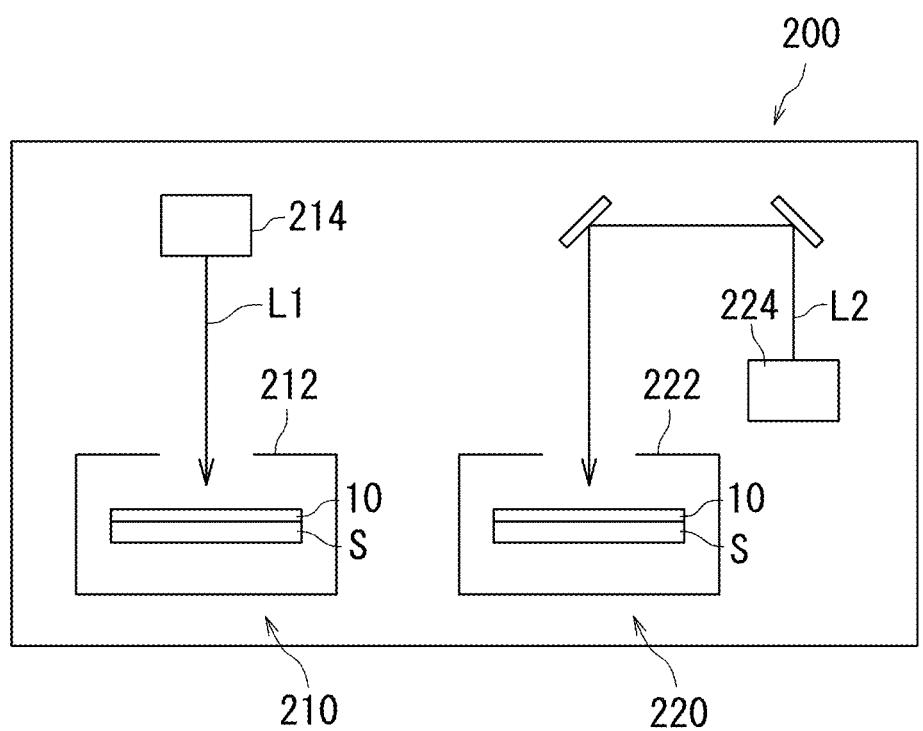
FIG. 11 is a schematic diagram of a latent resist image forming device suitable for implementation of a resist patterning method according to an embodiment of the present invention.

The flood exposure light source 224 emits beams for the flood exposure L2 to the resist layer 10 in the chamber 222 to form a latent pattern image. The beams for the flood exposure L2 are for example electromagnetic waves such as visible light and UV. In FIG. 11, the beam for the flood exposure L2 is reflected off mirrors and guided into the chamber 222. The flood exposure light source 224 for example includes an ion beam irradiation section, an electron beam irradiation section, or an electromagnetic wave irradiation section.

The flood exposure device 220 may further have a mechanism for processing the beam into the shape of a certain area. The flood exposure device 220 for example has a projection lens system and a block mask. Alternatively, the flood exposure device 220 may have the block mask but no projection lens system. It is favorable that the flood exposure device 220 has only the block mask because the configuration thereof is simpler.

Thus, the patterned exposure light source 214 may emit a beam in a pattern shape within an area of the resist layer 10, and thereafter the flood exposure light source 224 may emit a beam over the area to form a predetermined latent pattern image in the resist layer 10. The patterned exposure light source 214 is a pattern irradiation source that emits a beam in a pattern shape, whereas the flood exposure light source 224 is an area irradiation source.

The resist layer 10 may be developed by a developing device, not shown, after the latent pattern image has been formed in the resist layer 10. As a result of the developing, the resist layer 10 having a predetermined pattern is obtained.

Preferably, the latent resist image forming device 200 for example further includes a coater/developer (not shown herein) in addition to the patterned exposure device 210 including the patterned exposure light source 214 and the flood exposure device 220 including the flood exposure light source 224. The latent resist image forming device 200 including the coater/developer forms a pattern in the resist layer 10 as described below. First, the coater/developer forms an under layer on the substrate S by spin coating and bakes the under layer.

Next, the coater/developer deposits the resist layer 10 on the under layer and pre-bakes the resist layer 10. As needed, another layer may be formed on the resist layer 10 by spin coating and the layer may be baked.

Next, the patterned exposure light source 214 of the patterned exposure device 210 emits the beam to the resist layer 10. Thereafter, the flood exposure light source 224 of the flood exposure device 220 emits the beam to the resist layer 10. Thus, the latent pattern image is formed in the resist layer 10.

Next, the coater/developer performs post-baking. Thereafter, the coater/developer develops the resist layer 10. Thus, the resist layer 10 having a predetermined pattern shape is formed. Next, the coater/developer rinses the resist layer 10 with purified water and performs post-baking (drying). Through the above, a pattern can be formed in the resist layer 10.

In a configuration in which the substrate S is conveyed between the coater/developer, a location where the resist layer 10 is activated, and a location where a latent pattern image is formed in the resist layer 10, the substrate S is preferably conveyed under a predetermined inert gas atmosphere, active gas atmosphere, or vacuum atmosphere. A stage having a temperature adjusting function is suitably used as the conveying member.

The coater/developer may be disposed within the chamber 212 of the patterned exposure device 210 or disposed within the chamber 222 of the flood exposure device 220. Furthermore, the coater/developer may be disposed in a chamber shared by the patterned exposure device 210 and the flood exposure device 220.

In the description given above with reference to FIG. 11, the resist layer 10 in the chamber 212 is irradiated with the beam emitted from the patterned exposure light source 214, and the resist layer 10 in the chamber 222 is irradiated with the beam emitted from a different light source from the patterned exposure light source 214, that is, the flood exposure light source 224. However, the present invention is not limited to such a configuration.

Furthermore, in the description given above with reference to FIG. 11, the substrate S is taken out from the chamber 212 and then conveyed to chamber 222 once the resist layer 10 formed on the substrate S has been activated. However, the present invention is not limited to such a configuration. The substrate S may be conveyed from the chamber 212 to the chamber 222 through a communication path providing communication between the chamber 212 and the chamber 222.

Furthermore, in the description given above with reference to FIG. 11, the patterned exposure device 210 and the flood exposure device 220 include the chamber 212 and the chamber 222, respectively. However, the present invention is not limited to such a configuration. The patterned exposure device 210 and the flood exposure device 220 may share a single chamber.

The latent resist image forming device 200 described above with reference to FIG. 11 has one flood exposure device 220. However, the present invention is not limited to such a configuration. The latent resist image forming device 200 may include a plurality of flood exposure devices that each emit a beam having a different wavelength. Alternatively, one flood exposure device may emit different beams.

Figure 12:
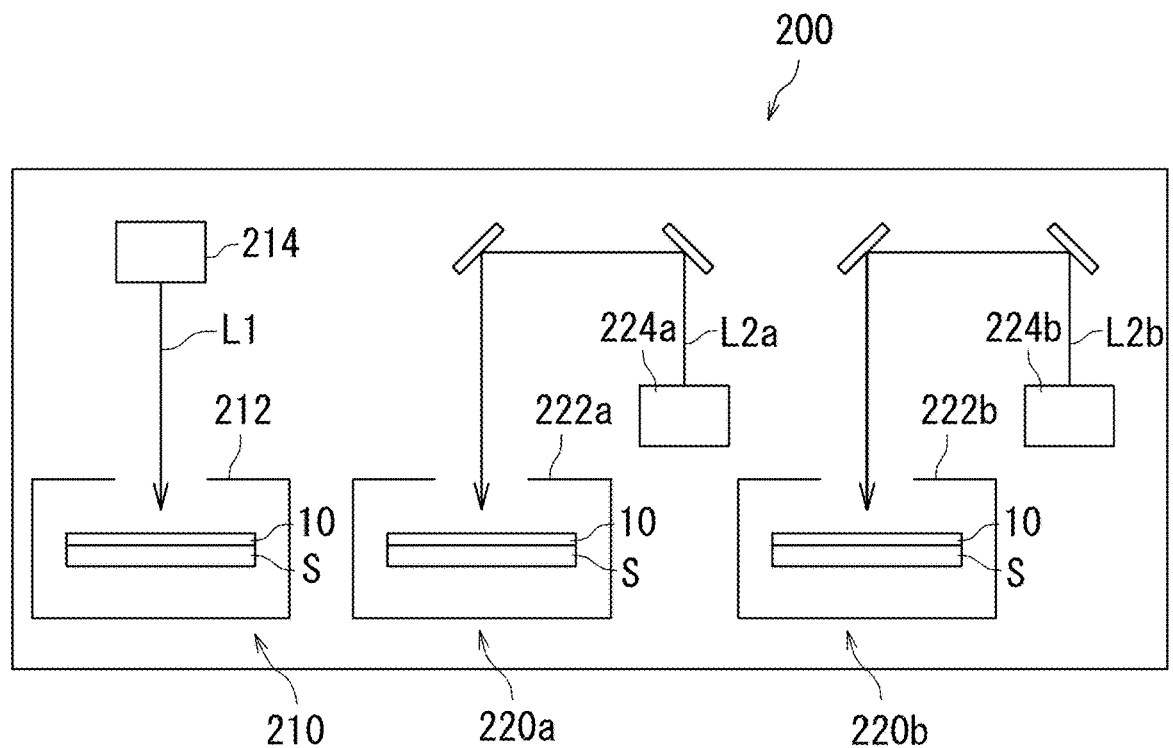
FIG. 12 is a schematic diagram of a latent resist image forming device suitable for implementation of a resist patterning method according to an embodiment of the present invention.

The following describes the latent resist image forming device 200 according to an embodiment of the present invention with reference to FIG. 12. The latent resist image forming device 200 according to the present embodiment has a similar configuration to the latent resist image forming device described above with reference to FIG. 11 except including two flood exposure devices. Accordingly, redundant description thereof is omitted in order to avoid repetition.

The latent resist image forming device 200 includes the patterned exposure device 210, a first flood exposure device 220a, and a second flood exposure device 220b. The patterned exposure device 210 performs the patterned exposure L1 on the resist layer 10 formed on the substrate S, and subsequently the first flood exposure device 220a performs the first flood exposure L2a on the resist layer 10 and the second flood exposure device 220b performs the second flood exposure L2b on the resist layer 10 to form a latent pattern image.

The patterned exposure device 210 includes the chamber 212 and the patterned exposure light source 214. The patterned exposure light source 214 emits a beam in a pattern shape to the resist layer 10 in the chamber 212. The beam from the patterned exposure light source 214 is electromagnetic waves such as visible light, UV, DUV, and EUV. Alternatively, the beam from the patterned exposure light source 214 may be an electron beam or an ion beam.

The first flood exposure device 220a has a chamber 222a and a first flood exposure light source 224a. The chamber 222a can accommodate the resist layer 10 formed on the substrate S. Preferably, the atmosphere inside the chamber 222a is an inert gas atmosphere, an active gas atmosphere, or a vacuum atmosphere.

The substrate S is conveyed from the patterned exposure device 210 to the first flood exposure device 220a after the patterned exposure device 210 performs the patterned exposure on the resist layer 10 formed on the substrate S. While the substrate S is being conveyed from the patterned exposure device 210 to the first flood exposure device 220a, the atmosphere inside the latent resist image forming device 200 is preferably an inert gas atmosphere, an active gas atmosphere, or a vacuum atmosphere.

The first flood exposure light source 224a emits the beam for the first flood exposure L2a to the resist layer 10 in the chamber 222a. The beam emitted from the first flood exposure light source 224a is applied over an area within the resist layer 10. The beam for the first flood exposure L2a is for example electromagnetic waves such as visible light and UV. In FIG. 12, the beam for the first flood exposure L2a is reflected off mirrors and guided into the chamber 222a.

The substrate S is conveyed from the first flood exposure device 220a to the second flood exposure device 220b after the first flood exposure device 220a performs the first flood exposure L2a on the resist layer 10 formed on the substrate S. While the substrate S is being conveyed from the first flood exposure device 220a to the second flood exposure device 220b, the atmosphere inside the latent resist image forming device 200 is preferably an inert gas atmosphere, an active gas atmosphere, or a vacuum atmosphere.

The second flood exposure device 220b has a chamber 222b and a second flood exposure light source 224b. The chamber 222b can accommodate the resist layer 10 formed on the substrate S. Preferably, the atmosphere inside the chamber 222b is an inert gas atmosphere, an active gas atmosphere, or a vacuum atmosphere.

The second flood exposure light source 224b emits the beam for the second flood exposure L2b to the resist layer 10 in the chamber 222b to form a latent pattern image. The beam emitted from the second flood exposure light source 224b is applied over the area within the resist layer 10. The beam for the second flood exposure L2b is for example electromagnetic waves such as visible light and UV. In FIG. 12, the beam for the second flood exposure L2b is reflected off mirrors and guided into the chamber 222.

Preferably, the beam emitted by the second flood exposure light source 224b has a longer wavelength than the beam emitted by the first flood exposure light source 224a. However, the beam emitted by the second flood exposure light source 224b may have a shorter wavelength than the beam emitted by the first flood exposure light source 224a.

The resist layer 10 may be developed by a developing device, not shown, after the latent pattern image has been formed in the resist layer 10. As a result of the developing, the resist layer 10 having a predetermined pattern is obtained.

In the description given above with reference to FIG. 12, different types of flood exposure are performed by different devices, that is, the first flood exposure device 220a and the second flood exposure device 220b. However, the present invention is not limited to such a configuration. Both the first flood exposure L2a and the second flood exposure L2b may be performed using a single flood exposure light source of a flood exposure device.

Figure 13:
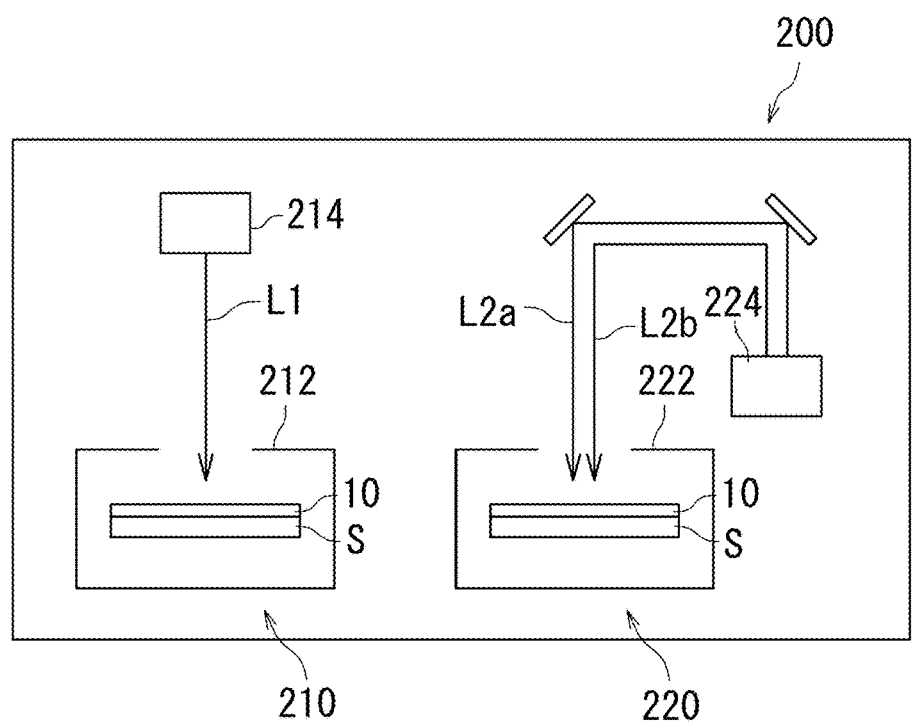
FIG. 13 is a schematic diagram of a latent resist image forming device suitable for implementation of a resist patterning method according to an embodiment of the present invention.

The following describes the latent resist image forming device 200 according to an embodiment of the present invention with reference to FIG. 13. The latent resist image forming device 200 according to the present embodiment has a similar configuration to the latent resist image forming device described above with reference to FIG. 12 except that both the first flood exposure L2a and the second flood exposure L2b are performed using the single flood exposure light source 224 in the flood exposure device 220. Accordingly, redundant description thereof is omitted in order to avoid repetition.

The flood exposure device 220 has the chamber 222 and the flood exposure light source 224. The chamber 222 can accommodate the resist layer 10 formed on the substrate S. Preferably, the atmosphere inside the chamber 222 is an inert gas atmosphere, an active gas atmosphere, or a vacuum atmosphere.

The flood exposure light source 224 emits beams for the flood exposure L2 to the resist layer 10 in the chamber 222 to form a latent pattern image. The beams for the flood exposure L2 are for example electromagnetic waves such as visible light and UV.

In the present embodiment, the flood exposure device 220 performs the first flood exposure L2a and the second flood exposure L2b. The flood exposure light source 224 emits the beam for the first flood exposure L2a to the resist layer 10 in the chamber 222. The beam emitted from the flood exposure light source 224 is applied over an area within the resist layer 10.

Thereafter, the flood exposure light source 224 emits the beam for the second flood exposure L2b to the resist layer 10 in the chamber 222. In the second flood exposure L2b, the beam emitted from the flood exposure light source 224 is also applied over the area within the resist layer 10. Typically, the beam for the second flood exposure L2b has a different wavelength from the beam for the first flood exposure L2a. As described above, both the first flood exposure L2a and the second flood exposure L2b may be performed using the single flood exposure light source 224 in the flood exposure device 220.

In the description given above, the flood exposure is performed after the patterned exposure. However, the present invention is not limited to such a configuration. Preliminary flood exposure may be performed prior to the patterned exposure. Alternatively, the production of the sensitizer Ps from the sensitizer precursor Pp does not need to be completed only by the patterned exposure, and flood exposure for production of the sensitizer Ps from the sensitizer precursor Pp may be performed after the patterned exposure.

In the description given above, the resist layer is a positive resist layer. However, the present invention is not limited to such a configuration. The resist layer may be a negative resist layer.

EXAMPLES

The following describes examples. Note that the present invention is not in any way limited to the examples.

Example 1

[A. Synthesis of Sensitizer Precursor]
(1) In a 200-mL four-necked flask, 2-bromonaphthalene (1.99 g, 9.60 mmol), 1,1-diphenyl-2-propyn-1-ol (2.00 g, 9.60 mmol), and copper iodide (12.8 mg, 0.07 mmol) were stirred in triethylamine (32 mL).
(2) The solution obtained in (1) was subjected to argon bubbling (50 mL/minute) for 15 minutes under stirring.
(3) $PdCl_2(PPh_3)_2$ (13.5 mg, 0.029 mmol) was added to the resultant reaction solution. The reaction solution was then heated under argon flow (200 mL/minute) until the internal temperature of the solution was 70° C. and stirred for 24 hours.
(4) The temperature of the reaction solution was returned to room temperature, followed by quenching through addition of ammonium chloride.
(5) Layer separation was performed using ethyl acetate and saturated brine, and the thus extracted organic layer was dehydrated through addition of magnesium sulfate.
(6) The solvent was evaporated using an evaporator to yield a crude product (approximately 2.8 g).
(7) The crude product was column purified using a silica gel column (150 mL).
Ethyl acetate/Hexane=1/6
(8) Drying was performed at 40° C. for 12 hours using a reduced pressure dryer.

Mass yield: 2.0 g (percentage yield: 62%)
(9) Results of $H^1$-NMR analysis and TOF-MS (molecular weight 344.4) confirmed that 1,1-diphenyl-3-(2-naphthyl)propargyl alcohol was obtained.

[B. Resist Exposure Experiment]

An underlayer was formed on a hexamethyldisilazane (HMDS)-treated silicon substrate.

Next, a resist material was prepared which included a poly(4-hydroxystyrene)-based polymer as the base resin R, a sulfonium-based strong acid generator as the strong acid generator SPA, 1,1-diphenyl-3-(2-naphthyl)propargyl alcohol as the sensitizer precursor Pp, and a base that reacts with a strong acid to produce a weak acid. The resist material was applied onto the underlayer, and spin coating was performed at 1,000 rpm for 120 seconds using a spin coater (Mikasa Co., Ltd.). After the spin coating, a heat treatment was performed at 100° C. for 1 minute, thereby forming a resist layer. The resist layer had a thickness of approximately 50 nm as measured after the spin coating using an atomic force microscope (AFM, NanoNavi II/SPA-300HV, product of Hitachi High-Tech Science Corporation). A topcoat was further formed on the resist layer.

The resist layer was irradiated at an irradiation current of 50 pA and an acceleration voltage of 125 keV using an electron beam exposure device (ELS-100T, equivalent to commercially-available ELS-125F), product of ELIONIX INC., as a patterned exposure device. After the patterned exposure L1, the resist layer was maintained in the atmosphere for one minute as an interval. Subsequently, flood exposure was performed. An LED light source (365 nm, product of IWASAKI ELECTRIC CO., LTD.) was used as a flood exposure device. The resist layer after the patterned exposure L1 was subjected to the flood exposure L2 in the atmosphere under an exposure condition of an exposure intensity of 40 $mW/cm^2$ at a resist surface. Thereafter, the resist layer was subjected to PEB under specific conditions and developed with a 2.38% tetramethylammonium hydroxide (TMAH) developing solution. The pattern size after the developing was evaluated using NVsion-40D (In-lens detector), product of ZEISS.

Figure 14A:
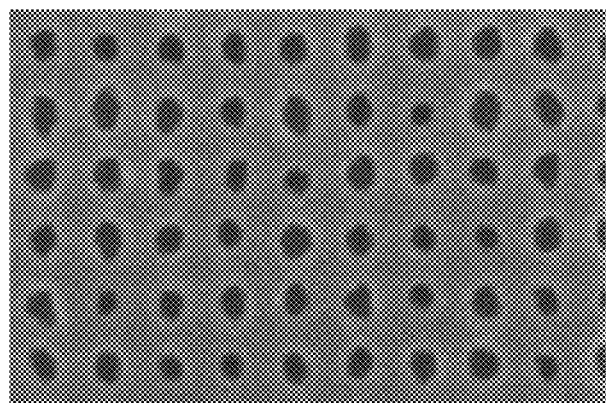
FIGS. 14A to 14C each show an SEM image of a resist layer according to an example.
Figure 14B:
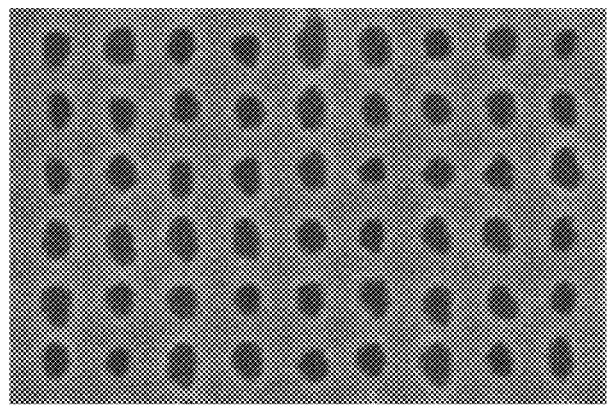
Figure 14C:
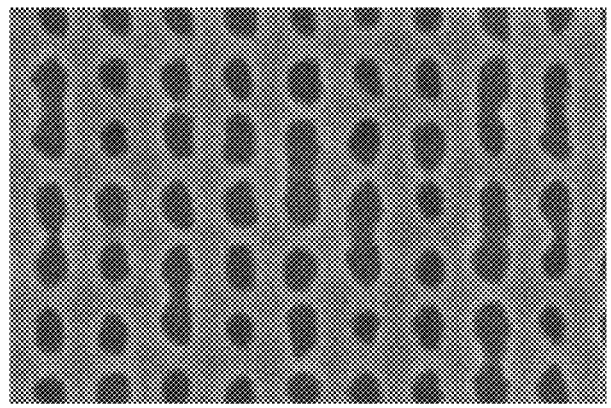

FIGS. 14A, 14B, and 14C each show an SEM image of the resist layer subjected to five-minute flood exposure after the patterned exposure. FIG. 14A shows the resist layer that was exposed, as the patterned exposure, to an electron beam at an exposure dose of 160 $\mu C/cm^2$ in a pattern of dots of 30 nm, subjected to the five-minute flood exposure, and subsequently developed. FIG. 14B shows the resist layer that was exposed, as the patterned exposure, to an electron beam at an exposure dose of 180 $\mu C/cm^2$ in a pattern of dots of 30 nm, subjected to the five-minute flood exposure, and subsequently developed. FIG. 14C shows the resist layer that was exposed, as the patterned exposure, to an electron beam at an exposure dose of 200 $\mu C/cm^2$ in a pattern of dots of 30 nm, subjected to the five-minute flood exposure, and subsequently developed.

As indicated by FIG. 14A, the electron beam at an exposure dose of 160 $\mu C/cm^2$ allowed formation of the pattern of dots despite the slightly insufficient exposure dose. As indicated by FIG. 14B, the electron beam at an exposure dose of 180 $\mu C/cm^2$ allowed adequate formation of the pattern of dots. As indicated by FIG. 14C, the electron beam at an exposure dose of 200 $\mu C/cm^2$ allowed formation of the pattern of dots despite the slight overexposure.

Some dots overlapping in an up-down direction are observed in the patterns shown in FIGS. 14A to 14C. The reason for the above is thought to be as follows. The value of the current for the evaluation was lower than the current value assured by the electron beam exposure device (ELS-100T, equivalent to commercially-available ELS-125F), product of ELIONIX INC., and was not suitable for evaluation of high-sensitivity chemically-amplified resists. Accordingly, the current was unstable and leaked in a beam sweeping direction (up-down direction). Since the dots were clearly spaced apart in a left-right direction, it is thought that the resist performance is good enough to form patterns of defined dots.

Furthermore, a resist layer was formed using the same resist material as the resist material mentioned above under the same conditions for processes such as pre-baking, PEB, and developing as those mentioned above except that the irradiation with LED light having a wavelength of 365 nm was not performed as the flood exposure.

Figure 15A:
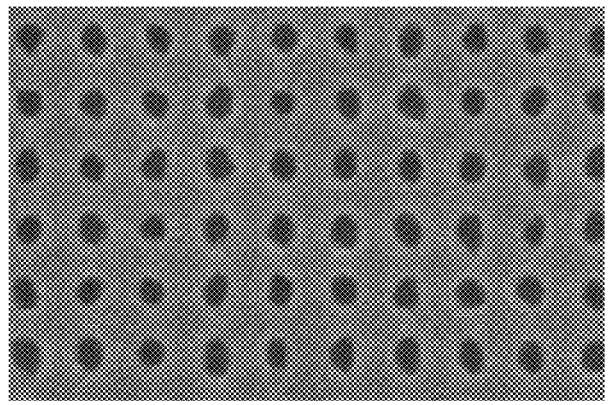
FIGS. 15A to 15C each show an SEM image of a resist layer according to an example.
Figure 15B:
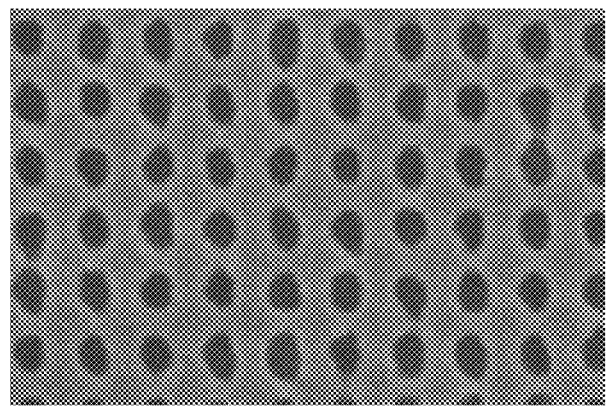
Figure 15C:
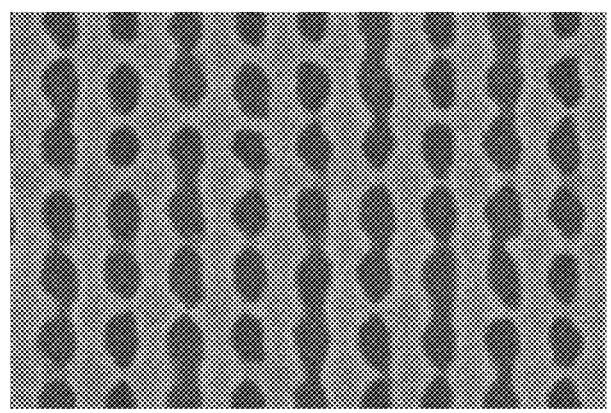

FIGS. 15A, 15B, and 15C each show an SEM image of the resist layer that was subjected to the patterned exposure, and subsequently developed without being subjected to flood exposure. FIG. 15A shows the resist layer that was exposed, as the patterned exposure, to an electron beam at an exposure dose of 240 µC/cm$^2$ in a pattern of dots of 30 nm, and subsequently developed without being subjected to flood exposure. FIG. 15B shows the resist layer that was exposed, as the patterned exposure, to an electron beam at an exposure dose of 300 µC/cm$^2$ in a pattern of dots of 30 nm, and subsequently developed without being subjected to flood exposure. FIG. 15C shows the resist layer that was exposed, as the patterned exposure, to an electron beam at an exposure dose of 360 µC/cm$^2$ in a pattern of dots of 30 nm, and subsequently developed without being subjected to flood exposure.

As indicated by FIG. 15A, the electron beam at an exposure dose of 240 µC/cm$^2$ allowed formation of the pattern of dots despite the absence of flood exposure and the slightly insufficient exposure dose. As indicated by FIG. 15B, the electron beam at an exposure dose of 300 µC/cm$^2$ allowed adequate formation of the pattern of dots. As indicated by FIG. 15C, the electron beam at an exposure dose of 360 µC/cm$^2$ allowed formation of the pattern of dots despite the absence of flood exposure and the slight overexposure.

Some dots overlapping in the up-down direction are observed in the patterns shown in FIGS. 15A to 15C. The reason for the overlapping is thought to be as follows as in the case of FIG. 14C. The value of the current for the evaluation was lower than the current value assured by the electron beam exposure device (ELS-100T, equivalent to commercially-available ELS-125F), product of ELIONIX INC., and was not suitable for evaluation of high-sensitivity chemically-amplified resists. Accordingly, the current was unstable and leaked in the beam sweeping direction (up-down direction). Since the dots were spaced apart in the left-right direction, it is thought that the resist performance is good enough to form patterns of defined dots.

According to conventional techniques, five-minute flood exposure performed in the atmosphere creates an effect of post-exposure delay due to a basic substance in the atmosphere, preventing formation of a high-resolution dot pattern. However, the use of 1,1-diphenyl-3-(2-naphthyl)propargyl alcohol, which is a sensitizer precursor capable of reacting with a weak acid to produce a sensitizer, in combination with a photodecomposable base (PDB) was proved to improve sensitivity of a high-resolution resist.

Figure 16A:
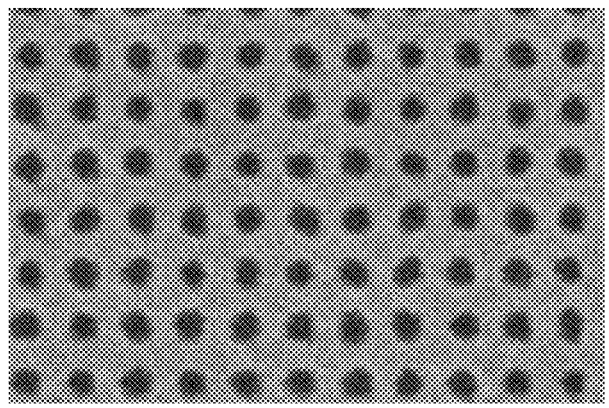
FIGS. 16A to 16C each show an SEM image of a resist layer according to an example.
Figure 16B:
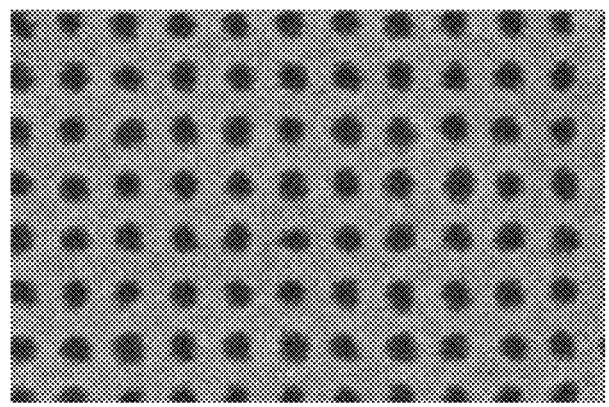
Figure 16C:
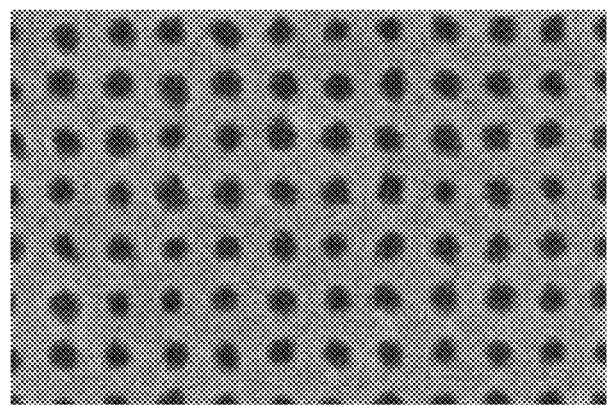

FIGS. 16A, 16B, and 16C each show an SEM image of a resist layer that contained the base resin R, the strong acid generator SPA, the sensitizer precursor Pp, and a base capable of reacting with a strong acid to produce a weak acid, and that was subjected to either or both of patterned exposure and flood exposure. This resist layer was formed as described above. A resist material was prepared which included a poly(4-hydroxystyrene)-based polymer as the base resin R, a sulfonium-based strong acid generator as the strong acid generator SPA, 1,1-diphenyl-3-(2-naphthyl)propargyl alcohol as the sensitizer precursor Pp, and a base capable of reacting with a strong acid to produce a weak acid. The resist material was applied onto an underlayer, and spin coating was performed at 1,000 rpm for 120 seconds using a spin coater (Mikasa Co., Ltd.). After the spin coating, a heat treatment was performed at 100° C. for 1 minute, thereby forming the resist layer. The resist layer had a thickness of approximately 50 nm as measured after the spin coating using an AFM (NanoNavi II/SPA-300HV, product of Hitachi High-Tech Science Corporation). A topcoat was further formed on the resist layer.

FIG. 16A shows the resist layer that was subjected to patterned exposure using an electron beam at an exposure dose of 500 µC/cm$^2$, and subsequently developed. FIG. 16B shows the resist layer that was subjected to patterned exposure using an electron beam at an exposure dose of 430 µC/cm$^2$, further subjected to flood exposure at an exposure dose of 2.4 J/cm$^2$, and subsequently developed. FIG. 16C shows the resist layer that was subjected to patterned exposure using an electron beam at an exposure dose of 360 µC/cm$^2$, further subjected to flood exposure at an exposure dose of 4.8 J/cm$^2$, and subsequently developed.

Figure 17A:
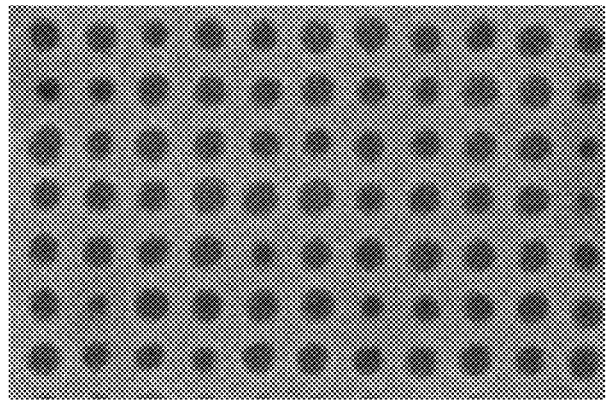
FIGS. 17A to 17C each show an SEM image of a resist layer according to a reference example.
Figure 17B:
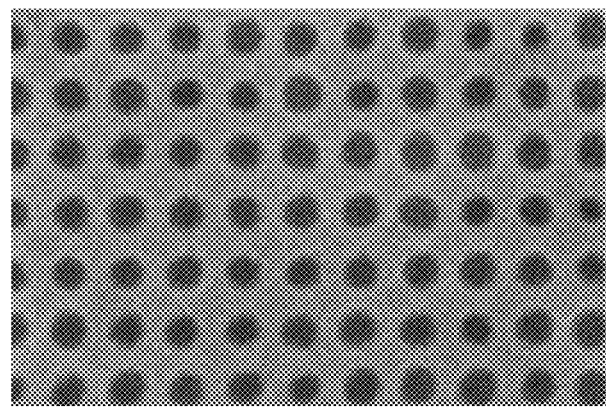
Figure 17C:
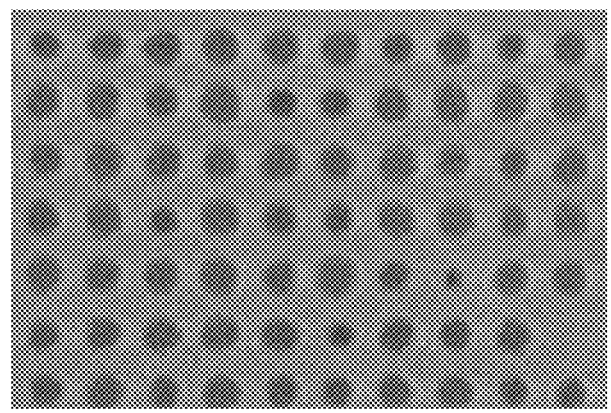

FIGS. 17A, 17B, and 17C each show an SEM image of a resist layer which contained a base different from that in the resist layer shown in FIGS. 16A to 16C and otherwise contained the same components, and which was subjected to either or both of patterned exposure and flood exposure. This base does not react with a strong acid to produce a weak acid.

FIG. 17A shows the resist layer that was subjected to patterned exposure using an electron beam at an exposure dose of 500 µC/cm$^2$, and subsequently developed. FIG. 17B shows the resist layer that was subjected to patterned exposure using an electron beam at an exposure dose of 460 µC/cm$^2$, further subjected to flood exposure at an exposure dose of 2.4 J/cm$^2$, and subsequently developed. FIG. 17C shows the resist layer that was subjected to patterned exposure using an electron beam at an exposure dose of 400 µC/cm$^2$, further subjected to flood exposure at an exposure dose of 7.2 J/cm$^2$, and subsequently developed.

In general, formation of a fine pattern needs a high concentration of base. However, the base reacts with a strong acid, and thus the amount of the strong acid, which reacts with the sensitizer precursor, is reduced. Accordingly, the amount of a sensitizer that is produced is also reduced. However, a base that reacts with a strong acid but forms a weak acid does not reduce the total acid amount of the strong acid and the weak acid.

Since 1,1-diphenyl-3-(2-naphthyl)propargyl alcohol, which is a sensitizer precursor capable of reacting with a weak acid formed as described above to produce a sensitizer, was used in the resist layer shown in FIGS. 16A to 16C, it was possible to improve the resist sensitivity. Furthermore, since the use of a high concentration of base did not reduce the amount of the sensitizer that was produced in the resist layer shown in FIGS. 16A to 16C, not only was the sensitivity improved, but the problematic photon shot noise was reduced.

In contrast, the resist shown in FIGS. 17A to 17C, in which the weak acid was not produced through the reaction between the strong acid and the base, and thus a lower amount of the sensitizer was produced, was not improved in sensitivity compared to the resist shown in FIGS. 16A to 16C. In particular, the patterned exposure using the electron beam at an exposure dose of 360 µC/cm² followed by the flood exposure at an exposure dose of 4.8 J/cm² allowed formation of the pattern of dots as shown in FIG. 16C, but the patterned exposure using the electron beam at a exposure dose of as high as 400 µC/cm² followed by the flood exposure at an exposure dose increased up to 7.2 J/cm² did not allow adequate formation of the pattern of dots as shown in FIG. 17C.

In order to form a resist pattern achieving reduction of roughness due to photon shot noise as well as an improvement in the sensitivity of the resist layer while solving the trade-off between the sensitivity, the resolution, and the line width roughness (LWR) in the present embodiment, it is preferable to efficiently produce the sensitizer Ps in a small region through the patterned exposure L1 and to efficiently produce the strong acid SAc in the small region using the sensitizer Ps through the flood exposure L2 while reducing distribution roughness. To this end, it is preferable to take note of at least one of the following points (1) to (5).

(1) In order that the sensitizer Ps is produced to have a concentration distribution that is substantially similar to the intensity distribution of the beam for the patterned exposure L1, it is preferable to directly ionize or excite the sensitizer precursor Pp through the patterned exposure L1 and decompose and/or isomerize the sensitizer precursor Pp to produce the sensitizer Ps. As descried above, the sensitizer Ps is preferably produced through direct ionization or excitation of the sensitizer precursor Pp.

(2) In a configuration in which the sensitizer precursor Pp reacts with a thermo-electron produced in the resist layer 10 through the patterned exposure L1 to directly produce the sensitizer Ps, the ionization product produced through the irradiation in the patterned exposure L1 has a concentration distribution that is substantially similar to the intensity distribution of the beam for the patterned exposure L1. However, the thermalization length of the electron produced from the ionization product is several nanometers. Furthermore, the frequency of the reaction between the thermo-electron and the sensitizer precursor Pp depends on the concentration of the sensitizer precursor Pp, and the length of the reaction is typically several nanometers. Accordingly, the sensitizer Ps produced with use of the ionization product has a concentration distribution that is slightly wider than the intensity distribution of the beam for the patterned exposure L1.

(3) The strong acid SAc and/or the radical are produced from the strong acid generator SPA through the patterned exposure L1, and the sensitizer precursor Pp reacts with the strong acid SAc and/or the radical to produce the sensitizer Ps. In such a configuration, the strong acid SAc and/or the radical are produced at a point several nanometers away from the ionization product produced through irradiation in the patterned exposure L1. The reaction between the sensitizer precursor Pp and the strong acid SAc and/or the radical depends on the concentration of the sensitizer precursor Pp, and the length of the reaction is several nanometers. Accordingly, the sensitizer Ps has a concentration distribution that is slightly wider than the intensity distribution of the beam for the patterned exposure L1.

(4) The sensitizer Ps excited through the flood exposure L2 reacts with the strong acid generator SPA to produce the strong acid SAc and/or the radical, and the sensitizer precursor Pp reacts with the strong acid SAc and/or the radical to produce the sensitizer Ps in the flood exposure step. The reaction between the excited sensitizer Ps and the strong acid generator SPA to produce the strong acid SAc and/or the radical is electron transfer or energy transfer from the excited sensitizer Ps to the strong acid generator SPA, and the reaction starts as a substantially isotropic reaction that is highly distance-dependent in three-dimensional space. Accordingly, the strong acid SAc and/or the radical are produced in a sphere around the exited sensitizer Ps. In contrast, the reaction between the sensitizer precursor Pp and the produced strong acid SAc and/or the radical to produce the sensitizer Ps is triggered by thermal diffusion or collision of the strong acid SAc and/or the radical. Accordingly, the sensitizer Ps is produced along random diffusion paths of the acid and the radical.

(5) It is preferable that the excited sensitizer Ps and the strong acid generator SPA are selected so that the acid formation reaction is efficiently promoted through the three-dimensional and highly isotropic electron transfer or energy transfer reaction from the exited sensitizer Ps to the strong acid generator SPA, and the concentration of the strong acid generator SPA is high. Furthermore, it is effective for reducing roughness or photon shot noise-induced roughness that the proportion of the acid formation reaction promoted by the three-dimensional and highly isotropic electron transfer or energy transfer reaction is larger than the proportion of the reaction along random diffusion paths of the strong acid SAc and/or the radical.

INDUSTRIAL APPLICABILITY

The resist patterning methods and the resist materials according to the present invention are suitably used in an exposure process of forming a resist pattern on a substrate. According to the resist patterning methods, the latent resist image forming devices, and the resist materials of the present invention, increased resist layer sensitivity can be achieved.

The invention claimed is:
1. A resist patterning method comprising:
a resist layer forming step of forming, on a substrate, a resist layer containing a base resin, a sensitizer precursor, a strong acid generator, and a base;
a patterned exposure step of performing patterned exposure on the resist layer to produce a sensitizer from the sensitizer precursor;
a flood exposure step of performing flood exposure on the resist layer in which the sensitizer has been produced to produce an acid from a portion of the strong acid generator after the patterned exposure step; and
a developing step of developing the resist layer after the flood exposure step, wherein the patterned exposure step includes:
a step of producing a strong acid from a portion of the strong acid generator;
a first sensitizer production step of producing a sensitizer through a reaction between the strong acid and the sensitizer precursor; and
a step of producing a weak acid through a reaction between the strong acid and the base, the weak acid having a degree of ionization lower than a degree of ionization of the strong acid, and
a second sensitizer production step of producing a sensitizer through a reaction between the weak acid and the sensitizer precursor, and
the sensitizer produced in the patterned exposure step includes the sensitizer produced in the first sensitizer production step and the sensitizer produced in the second sensitizer production step.

2. The resist patterning method according to claim 1, wherein in the resist layer forming step, the sensitizer precursor includes at least one compound selected from the group consisting of 1,1-diphenyl-3-(2-naphthyl)propargyl alcohol, 1,1-diphenyl-3-phenyl propargyl alcohol, 1,1-diphenyl-3-para-chlorophenyl propargyl alcohol, 1,1-diphenyl-3-para-methylphenyl propargyl alcohol, 1,1-diphenyl-3-para-methoxyphenyl propargyl alcohol, 1-phenyl-1-para-chlorophenyl-3-phenyl propargyl alcohol, 1-phenyl-1-para-methylphenyl-3-phenyl propargyl alcohol, 1-phenyl-1-para-methoxyphenyl-3-phenyl propargyl alcohol, 1,1-diphenyl-3-[4-(trifluoromethyl)phenyl]propargyl alcohol, and derivatives of any of the aforementioned compounds.

3. The resist patterning method according to claim 1, wherein in the resist layer forming step, the base includes a photodecomposable base.

4. The resist patterning method according to claim 1, wherein in the resist layer forming step, the resist layer further contains a base generator.

5. The resist patterning method according to claim 4, wherein the flood exposure step includes:

a first flood exposure step of performing first flood exposure through which the sensitizer is excited, and the acid is produced through a reaction between the excited sensitizer and the strong acid generator; and a second flood exposure step of performing second flood exposure through which a base is produced from the base generator.

6. The resist patterning method according to claim 1, further comprising a modification step of performing a modification treatment for transforming the resist layer from a positive type to a negative type or vice versa after the flood exposure step.

7. The resist patterning method according to claim 1, further comprising an underlayer forming step of forming an underlayer between the resist layer and the substrate.

8. The resist patterning method according to claim 1, further comprising a topcoat forming step of forming a topcoat on the resist layer.

9. The resist patterning method according to claim 1, wherein in the flood exposure step, a period of time of the flood exposure is not longer than one minute.

10. The resist patterning method according to claim 1, wherein in the flood exposure step, an absorption spectrum of the sensitizer does not change during the flood exposure.

\* \* \* \* \*